(12) United States Patent
Choi et al.

(10) Patent No.: US 10,930,739 B2
(45) Date of Patent: Feb. 23, 2021

(54) THREE-DIMENSIONAL SEMICONDUCTOR MEMORY DEVICES AND METHODS FOR FABRICATING THE SAME

(71) Applicant: Samsung Electronics Co., Ltd., Suwon-si (KR)

(72) Inventors: Ji-Hoon Choi, Seongnam-si (KR); Dongkyum Kim, Suwon-si (KR); Sunggil Kim, Yongin-si (KR); Seulye Kim, Seoul (KR); Sangsoo Lee, Seongnam-si (KR); Hyeeun Hong, Bucheon-si (KR)

(73) Assignee: Samsung Electronics Co., Ltd.

( * ) Notice: Subject to any disclaimer, the term of this patent is extended or adjusted under 35 U.S.C. 154(b) by 57 days.

(21) Appl. No.: 16/186,915

(22) Filed: Nov. 12, 2018

(65) Prior Publication Data

US 2019/0181226 A1   Jun. 13, 2019

(30) Foreign Application Priority Data

Dec. 8, 2017 (KR) .................. 10-2017-0168559

(51) Int. Cl.
| | |
|---|---|
| *H01L 29/10* | (2006.01) |
| *H01L 27/11556* | (2017.01) |
| *H01L 27/11573* | (2017.01) |
| *H01L 29/423* | (2006.01) |
| *H01L 27/11526* | (2017.01) |
| *H01L 27/11582* | (2017.01) |
| *H01L 27/1157* | (2017.01) |

(Continued)

(52) U.S. Cl.
CPC ...... *H01L 29/1037* (2013.01); *H01L 27/1157* (2013.01); *H01L 27/11526* (2013.01); *H01L 27/11556* (2013.01); *H01L 27/11565* (2013.01); *H01L 27/11573* (2013.01); *H01L 27/11575* (2013.01); *H01L 27/11582* (2013.01); *H01L 29/42368* (2013.01)

(58) Field of Classification Search
CPC ................................................. H01L 27/11526
See application file for complete search history.

(56) References Cited

U.S. PATENT DOCUMENTS 9,230,980 B2  1/2016 Rabkin et al.
9,524,977 B2  12/2016 Sharangpani et al.
(Continued)

*Primary Examiner* — William A Harriston
(74) *Attorney, Agent, or Firm* — Myers Bigel, P.A.

(57) ABSTRACT

A three-dimensional semiconductor memory device includes an electrode structure including electrodes vertically stacked on a semiconductor layer, a vertical semiconductor pattern penetrating the electrode structure and connected to the semiconductor layer, and a vertical insulating pattern between the electrode structure and the vertical semiconductor pattern. The vertical insulating pattern includes a sidewall portion on a sidewall of the electrode structure, and a protrusion extending from the sidewall portion along a portion of a top surface of the semiconductor layer. The vertical semiconductor pattern includes a vertical channel portion having a first thickness and extending along the sidewall portion of the vertical insulating pattern, and a contact portion extending from the vertical channel portion and conformally along the protrusion of the vertical insulating pattern and the top surface of the semiconductor layer. The contact portion has a second thickness greater than the first thickness.

20 Claims, 31 Drawing Sheets

(51) Int. Cl.
*H01L 27/11565* (2017.01)
*H01L 27/11575* (2017.01)

(56) References Cited

U.S. PATENT DOCUMENTS

| | | |
|---|---|---|
| 9,576,967 B1 | 2/2017 | Kimura et al. |
| 9,646,990 B2 | 5/2017 | Koka et al. |
| 9,754,963 B1 | 9/2017 | Kawamura et al. |
| 9,773,806 B1 | 9/2017 | Lee et al. |
| 9,847,346 B2 | 12/2017 | Lee et al. |
| 2013/0056820 A1 | 3/2013 | Jeong |
| 2014/0035026 A1 | 2/2014 | Jang et al. |
| 2015/0194435 A1* | 7/2015 | Lee .................. H01L 27/11575 257/329 |
| 2015/0340376 A1 | 11/2015 | Park et al. |
| 2016/0104719 A1 | 4/2016 | Jung et al. |
| 2016/0276353 A1 | 9/2016 | Kobayashi et al. |
| 2016/0276365 A1 | 9/2016 | Choi et al. |
| 2017/0098658 A1 | 4/2017 | Matsuda et al. |
| 2017/0103998 A1 | 4/2017 | Chang et al. |
| 2017/0271262 A1 | 9/2017 | Naito et al. |
| 2018/0315770 A1 | 11/2018 | Choi et al. |

\* cited by examiner

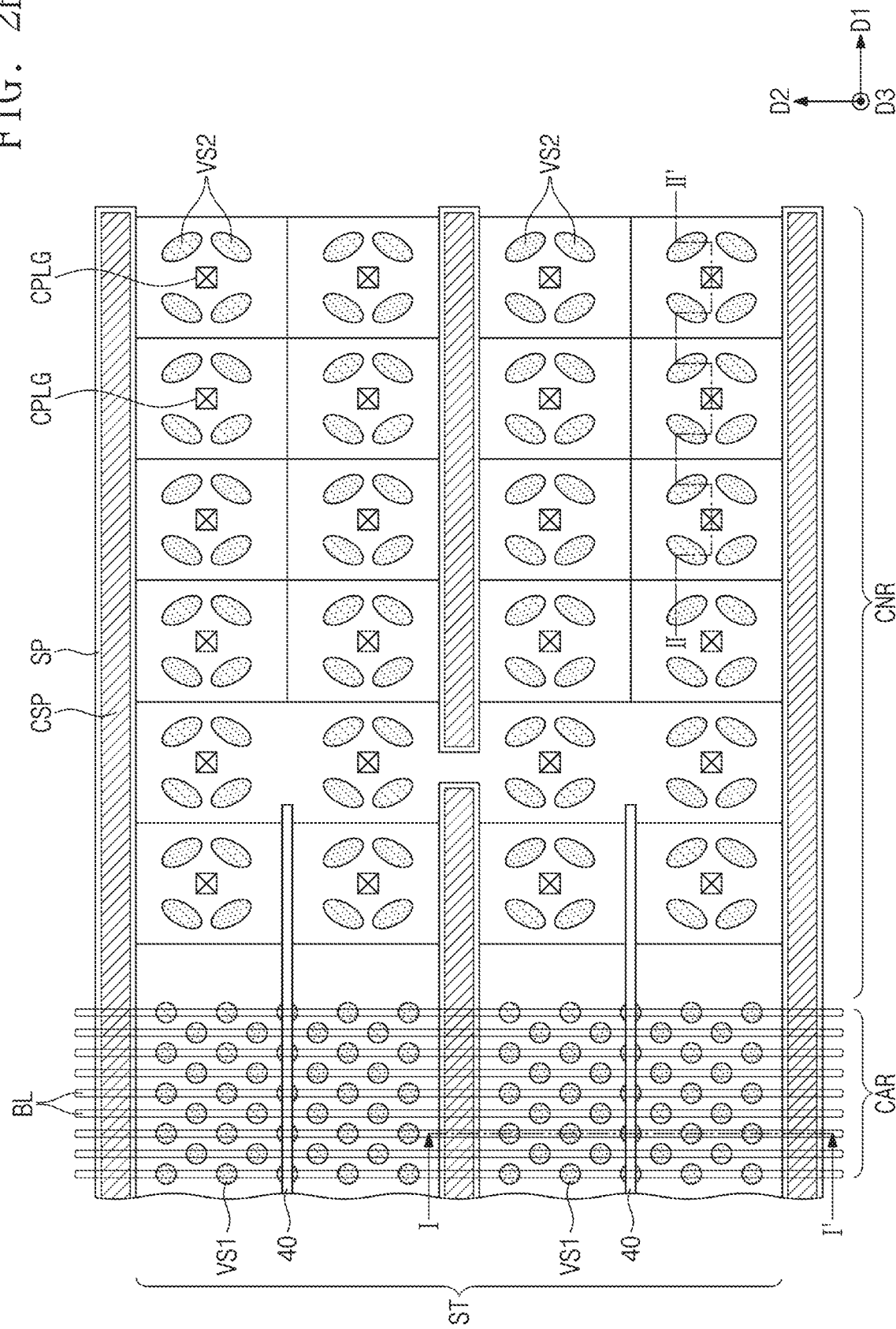

THREE-DIMENSIONAL SEMICONDUCTOR MEMORY DEVICES AND METHODS FOR FABRICATING THE SAME

CROSS-REFERENCE TO RELATED APPLICATION

This U.S. non-provisional patent application claims priority under 35 U.S.C. § 119 to Korean Patent Application No. 10-2017-0168559, filed on Dec. 8, 2017, in the Korean Intellectual Property Office, the disclosure of which is hereby incorporated by reference in its entirety.

BACKGROUND

Embodiments of the inventive concepts relate to three-dimensional (3D) semiconductor memory devices and methods for fabricating the same and, more particularly, to 3D semiconductor memory devices with improved reliability and integration density and methods for fabricating the same.

Semiconductor devices have been highly integrated so as to increase performance and reduce manufacturing costs. The integration density of semiconductor devices directly affects the costs of the semiconductor devices. The integration density of two-dimensional (2D) or planar semiconductor devices may be mainly determined by an area occupied by a unit memory cell. Therefore, the integration density of 2D or planar semiconductor devices may be affected by a technique of forming fine patterns. However, since high-priced apparatus may be used to form fine patterns, the integration density of 2D semiconductor devices continues to increase but is still limited. Thus, three-dimensional (3D) semiconductor memory devices have been developed to address the above and other limitations. 3D semiconductor memory devices may include memory cells three-dimensionally arranged.

SUMMARY

Embodiments of the inventive concepts may provide three-dimensional (3D) semiconductor memory devices capable of improving reliability and integration density.

Embodiments of the inventive concepts may also provide methods for fabricating a 3D semiconductor memory device, which is capable of improving reliability and integration density.

In some embodiments, a 3D semiconductor memory device may include an electrode structure including electrodes vertically stacked on a semiconductor layer, a vertical semiconductor pattern penetrating the electrode structure and connected to the semiconductor layer, and a vertical insulating pattern disposed between the electrode structure and the vertical semiconductor pattern. The vertical insulating pattern may include a sidewall portion on a sidewall of the electrode structure, and a protrusion extending from the sidewall portion on a portion of a top surface of the semiconductor layer. The vertical semiconductor pattern may include a vertical channel portion having a first thickness and extending along the sidewall portion of the vertical insulating pattern, and a contact portion extending from the vertical channel portion and conformally along the protrusion of the vertical insulating pattern and the top surface of the semiconductor layer. The contact portion may have a second thickness greater than the first thickness.

In some embodiments, a 3D semiconductor memory device may include a substrate including a first region and a second region, an electrode structure including electrodes vertically stacked on the substrate, a first vertical structure penetrating the electrode structure on the first region and having a first width, a second vertical structure penetrating the electrode structure on the second region and having a second width greater than the first width, and a lower semiconductor pattern disposed between the substrate and each of the first and second vertical structures and connected to the substrate. Each of the first and second vertical structures may include a vertical semiconductor pattern connected to the lower semiconductor pattern, and a vertical insulating pattern disposed between the electrode structure and the vertical semiconductor pattern on the lower semiconductor pattern. The vertical insulating pattern may include a sidewall portion on a sidewall of the electrode structure, and a protrusion extending on a portion of a top surface of the lower semiconductor pattern. The vertical semiconductor pattern may include a vertical channel portion having a first thickness on the sidewall portion of the vertical insulating pattern, and a contact portion having a second thickness, greater than the first thickness, on a sidewall of the protrusion of the vertical insulating pattern.

BRIEF DESCRIPTION OF THE DRAWINGS

The inventive concepts will become more apparent in view of the attached drawings and accompanying detailed description.

FIGS. 2A and 2B are plan views illustrating 3D semiconductor memory devices according to some embodiments of the inventive concepts.

DETAILED DESCRIPTION OF THE EMBODIMENTS

Embodiments of the inventive concepts will be described hereinafter in detail with reference to the accompanying drawings.

Figure 1:
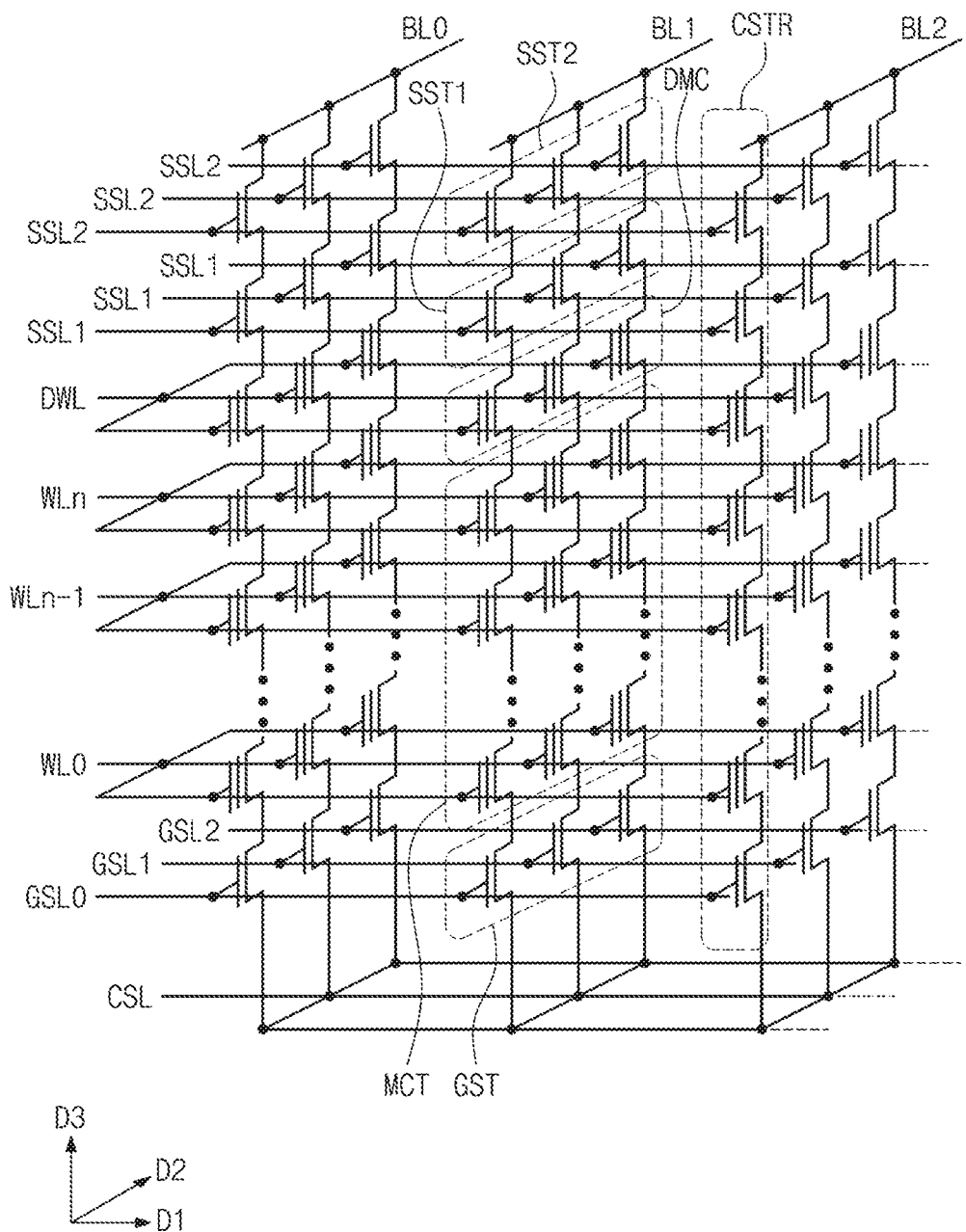
FIG. 1 is a circuit diagram illustrating a cell array of a three-dimensional (3D) semiconductor memory device according to some embodiments of the inventive concepts.

FIG. 1 is a circuit diagram illustrating a cell array of a three-dimensional (3D) semiconductor memory device according to some embodiments of the inventive concepts.

Referring to FIG. 1, a cell array of a 3D semiconductor memory device according to some embodiments may include a common source line CSL, a plurality of bit lines BL0 to BL2, and a plurality of cell strings CSTR connected between the common source line CSL and the bit lines BL0 to BL2. In some embodiments, the three-dimensional semiconductor memory device may be a vertical-type NAND FLASH memory device.

The bit lines BL0 to BL2 may be spaced apart from each other in a first direction D1 and may extend in a second direction D2. As used herein, the terms first, second, third, etc. are used merely to differentiate one direction, region, portion, or element from another. The cell strings CSTR may be two-dimensionally arranged in first and second directions D1 and D2 and may extend in a third direction D3. A plurality of the cell strings CSTR may be connected in parallel to each of the bit lines BL0 to BL2. A plurality of the cell strings CSTR may be connected in common to the common source line CSL.

In some embodiments, each of the cell strings CSTR may include first and second string selection transistors SST1 and SST2 connected in series to each other, memory cells MCT connected in series to each other, and a ground selection transistor GST. Each of the memory cells MCT may include a data storage element. The second string selection transistor SST2 may be connected to one of the bit lines BL0 to BL2, and the ground selection transistor GST may be connected to the common source line CSL. The memory cells MCT may be connected in series between the first string selection transistor SST1 and the ground selection transistor GST. In addition, each of the cell strings CSTR may further include a dummy cell DMC connected between the first string selection transistor SST1 and the memory cell MCT.

Figure 2A:
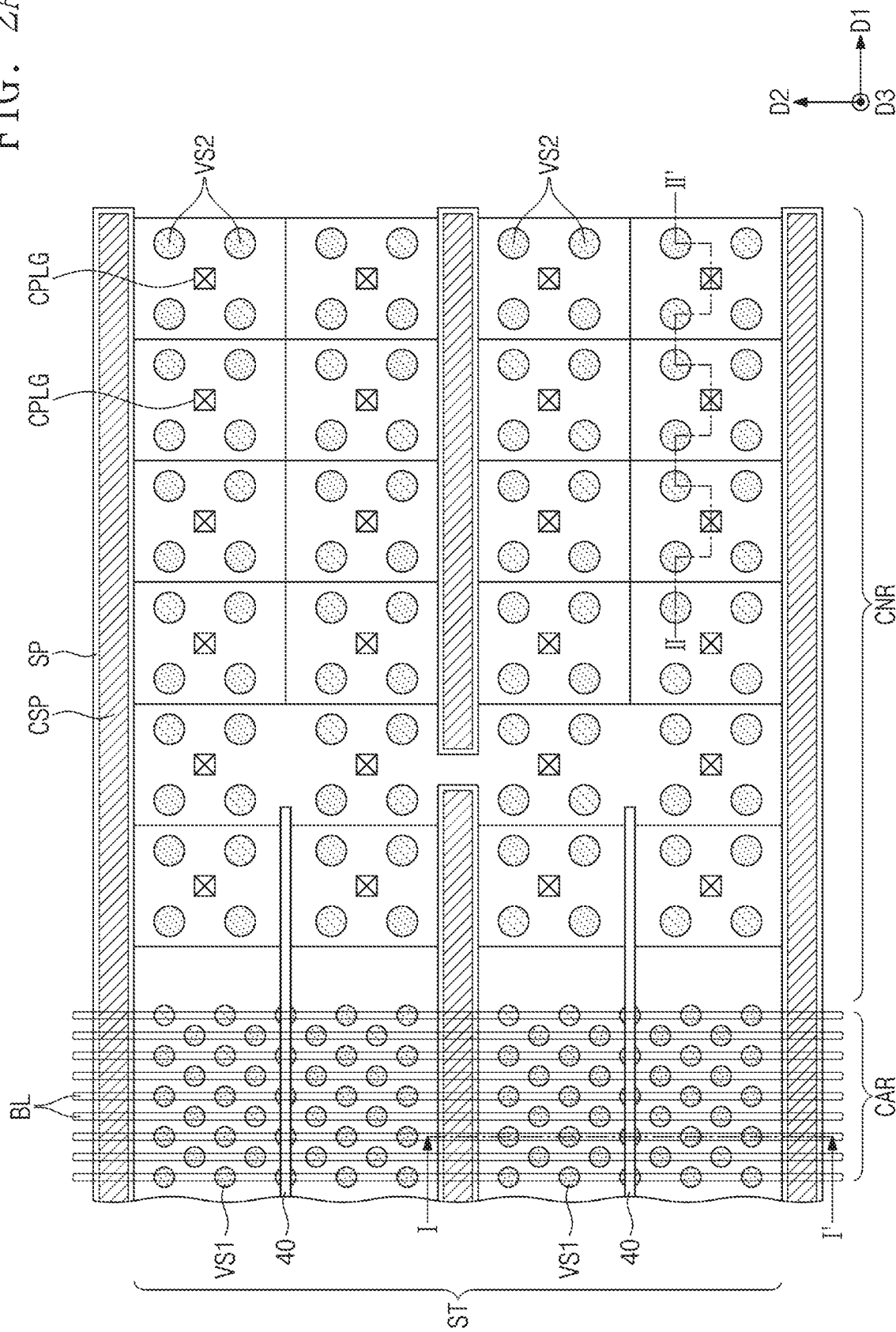
Figure 3:
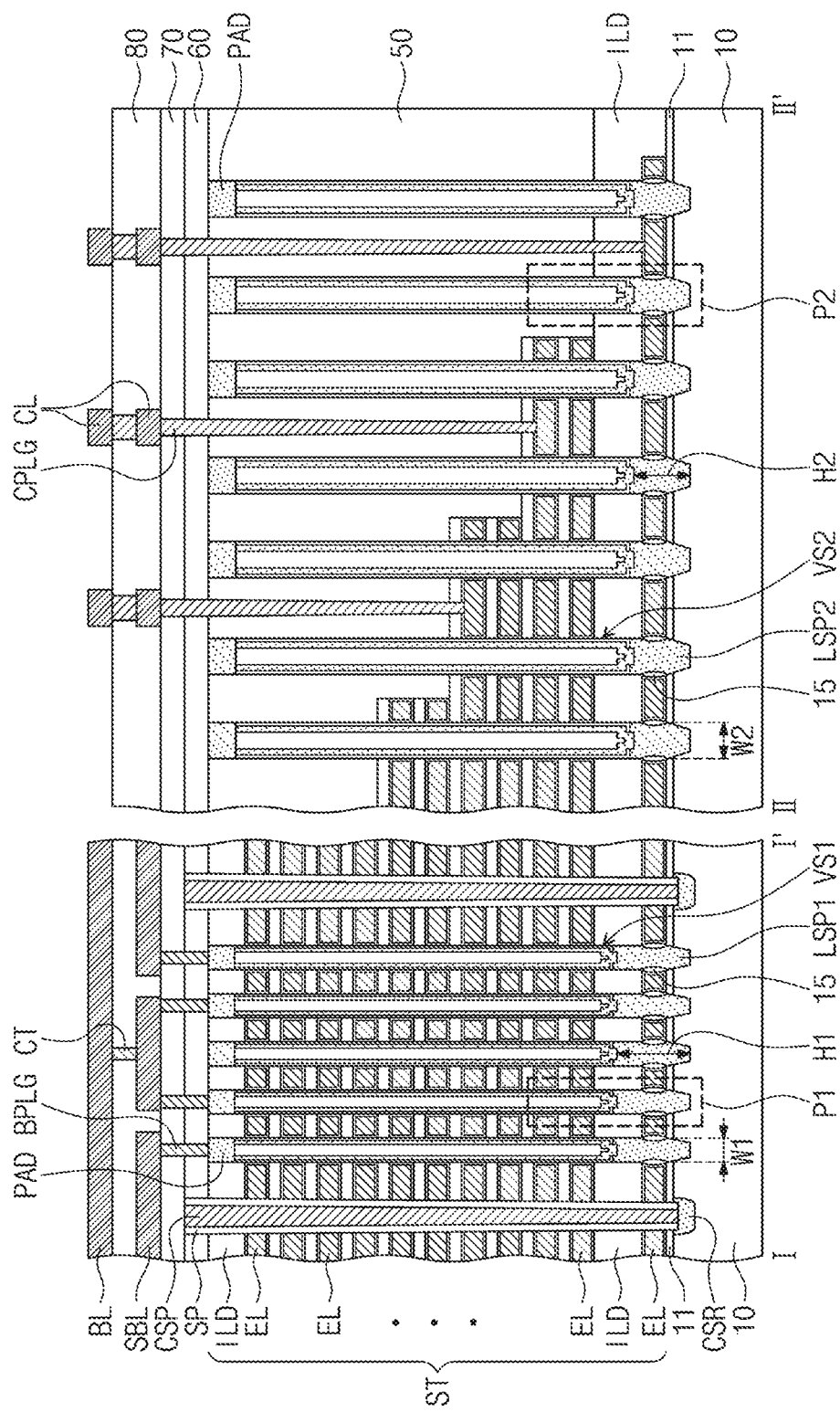
FIG. 3 is a cross-sectional view taken along lines I-I' and II-II' of FIG. 2A or 2B to illustrate a 3D semiconductor memory device according to some embodiments of the inventive concepts.

FIGS. 2A and 2B are plan views illustrating 3D semiconductor memory devices according to some embodiments of the inventive concepts. FIG. 3 is a cross-sectional view taken along lines I-I' and II-II' of FIG. 2A or 2B to illustrate a 3D semiconductor memory device according to some embodiments of the inventive concepts. FIGS. 4A, 4B, 4C, 4D and 4E are enlarged views of portions P1' and P2' of FIG. 3 to illustrate portions of 3D semiconductor memory devices according to some embodiments of the inventive concepts.

Referring to FIGS. 2A, 2B and 3, a substrate 10 may include a cell array region CAR and a connection region CNR. The substrate 10 may include a material having semiconductor characteristics (e.g., a silicon wafer), an insulating material (e.g., a glass substrate), or a semiconductor or conductor covered with an insulating material. For example, the substrate 10 may be a silicon wafer having a first conductivity type. As used herein, an element described as "covered" or "covering" or "surrounded by" another element does not require complete coverage or surrounding.

An electrode structure ST may be provided on the substrate 10 and may extend from the cell array region CAR onto the connection region CNR in a first direction D1. When an element is referred to as being "on" or "connected to" or "adjacent" another element (e.g., a layer or substrate), it can be directly on or connected to or adjacent the other element, or intervening elements may also be present. In contrast, when an element is referred to as being "directly on" or "directly connected to" or "immediately adjacent" another element, there are no intervening elements present. The electrode structure ST may be provided in plurality on the substrate 10, and the electrode structures ST may be spaced apart from each other in a second direction D2 perpendicular to the first direction D1. Here, the first direction D1 and the second direction D2 may be horizontal directions that are substantially parallel to a top surface of the substrate 10. A buffer insulating layer 11 may be disposed between the electrode structure ST and the substrate 10 and may include a silicon oxide layer.

The electrode structure ST may include electrodes EL and insulating layers ILD which are alternately and repeatedly stacked in a third direction D3 (i.e., a vertical direction) vertical to the top surface of the substrate 10. Thicknesses of the electrodes EL may be substantially equal to each other, and thicknesses of the insulating layers ILD may be changed or may differ depending on characteristics of the 3D semiconductor memory device. The thickness of each of at least some of the insulating layers ILD may be less than the thickness of each of the electrodes EL. In some embodiments, one of the insulating layers ILD may be thicker than the electrode EL. For example, the electrodes EL may include a doped semiconductor material (e.g., doped silicon), a metal (e.g., tungsten, copper, or aluminum), a conductive metal nitride (e.g., titanium nitride or tantalum nitride), and/or a transition metal (e.g., titanium or tantalum). The term "and/or" includes any and all combinations of one or more of the associated listed items. Each of the insulating layers ILD may include, for example, a silicon oxide layer or a low-k dielectric layer.

The electrode structure ST may have a stepped structure on the connection region CNR. In detail, lengths of the electrodes EL in the first direction D1 may sequentially decrease as a vertical distance from the substrate 10 increases, and a height of the electrode structure ST may decrease as a horizontal distance from the cell array region CAR increases. In addition, sidewalls of the electrodes EL on the connection region CNR may be arranged in the first direction D1 at equal intervals when viewed in a plan view. Each of the electrodes EL may have a pad portion on the connection region CNR, and the pad portions of the electrodes EL may be located at positions horizontally and vertically different from each other. Electrodes located at an uppermost layer of the electrodes EL may have line shapes extending in the first direction D1 and may be spaced apart from each other by an isolation insulating pattern 40.

In some embodiments, the 3D semiconductor memory device may be a vertical NAND flash memory device. In this case, at least some of the electrodes EL of the electrode structure ST may be used as control gate electrodes of the memory cells (or memory cell transistors) MCT and DMC of FIG. 1. For example, the electrodes EL may be used as ground selection lines GSL0 to GSL2, word lines WL0 to WLn and DWL and string selection lines SSL1 and SSL2, which are illustrated in FIG. 1.

A planarization insulating layer 50 may cover the electrode structure ST on the substrate 10. The planarization insulating layer 50 may have a substantially flat top surface and may cover the stepped structure of the electrode structure ST on the connection region CNR. The planarization insulating layer 50 may include one insulating layer or a plurality of stacked insulating layers. For example, the planarization insulating layer 50 may include a silicon oxide layer and/or a low-k dielectric layer.

A plurality of first vertical structures VS1 may penetrate the electrode structure ST on the cell array region CAR, and a plurality of second vertical structures VS2 may penetrate the planarization insulating layer 50 and the electrode structure ST on the connection region CNR.

The first vertical structures VS1 may be arranged in a matrix form or in a zigzag form when viewed in a plan view. Each of the first vertical structures VS1 may have a circular top surface. Widths of the second vertical structures VS2 may be greater than widths of the first vertical structures VS1. In some embodiments, a top surface of each of the second vertical structures VS2 may have a circular shape as illustrated in FIG. 2A. Alternatively, the top surface of each of the second vertical structures VS2 may have an elliptical shape as illustrated in FIG. 2B or may have a bar shape. The top surfaces of the second vertical structures VS2 may be disposed at substantially the same level as the top surfaces of the first vertical structures VS1. A plurality of the second vertical structures VS2 may penetrate the pad portion of each of the electrodes EL. The number of the electrodes EL which the second vertical structures VS2 penetrate may decrease as a horizontal distance from the cell array region CAR increases. The plurality of second vertical structures VS2 penetrating each of the pad portions may be disposed to surround each of cell contact plugs CPLG when viewed in a plan view. In some embodiments, some of the second vertical structures VS2 may penetrate boundaries of the pad portions vertically adjacent to each other, when viewed in a plan view. In certain embodiments, the arrangement of the second vertical structures VS2 may be variously modified. A conductive pad PAD connected to a bit line contact plug BPLG may be disposed on a top end of each of the first vertical structures VS1, i.e., on a top end of a first vertical semiconductor pattern USP1. Likewise, a conductive pad PAD may be disposed on a top end of each of the second vertical structures VS2.

In some embodiments, a first lower semiconductor pattern LSP1 may be disposed between the substrate 10 and each of the first vertical structures VS1, and a second lower semiconductor pattern LSP2 may be disposed between the substrate 10 and each of the second vertical structures VS2. The second lower semiconductor pattern LSP2 may be a dummy lower semiconductor pattern. Spatially relative terms, such as "beneath," "below," "lower," "above," "upper" "higher," and the like, are intended to encompass different orientations of the device in use or operation in addition to the orientation depicted in the figures. Respective "levels" as described herein may be relative to the substrate 10.

The first and second lower semiconductor patterns LSP1 and LSP2 may be in direct contact with the substrate 10 and may include pillar-shaped epitaxial patterns grown from the substrate 10. In some embodiments, the first and second lower semiconductor patterns LSP1 and LSP2 may be formed of single-crystalline silicon (Si). Alternatively, the first and second lower semiconductor patterns LSP1 and LSP2 may include germanium (Ge), silicon-germanium (SiGe), a group III-V semiconductor compound, or a group II-VI semiconductor compound. The first and second lower semiconductor patterns LSP1 and LSP2 may be undoped patterns or may be doped with dopants of which a conductivity type is the same as that of the substrate 10.

Figure 4A:
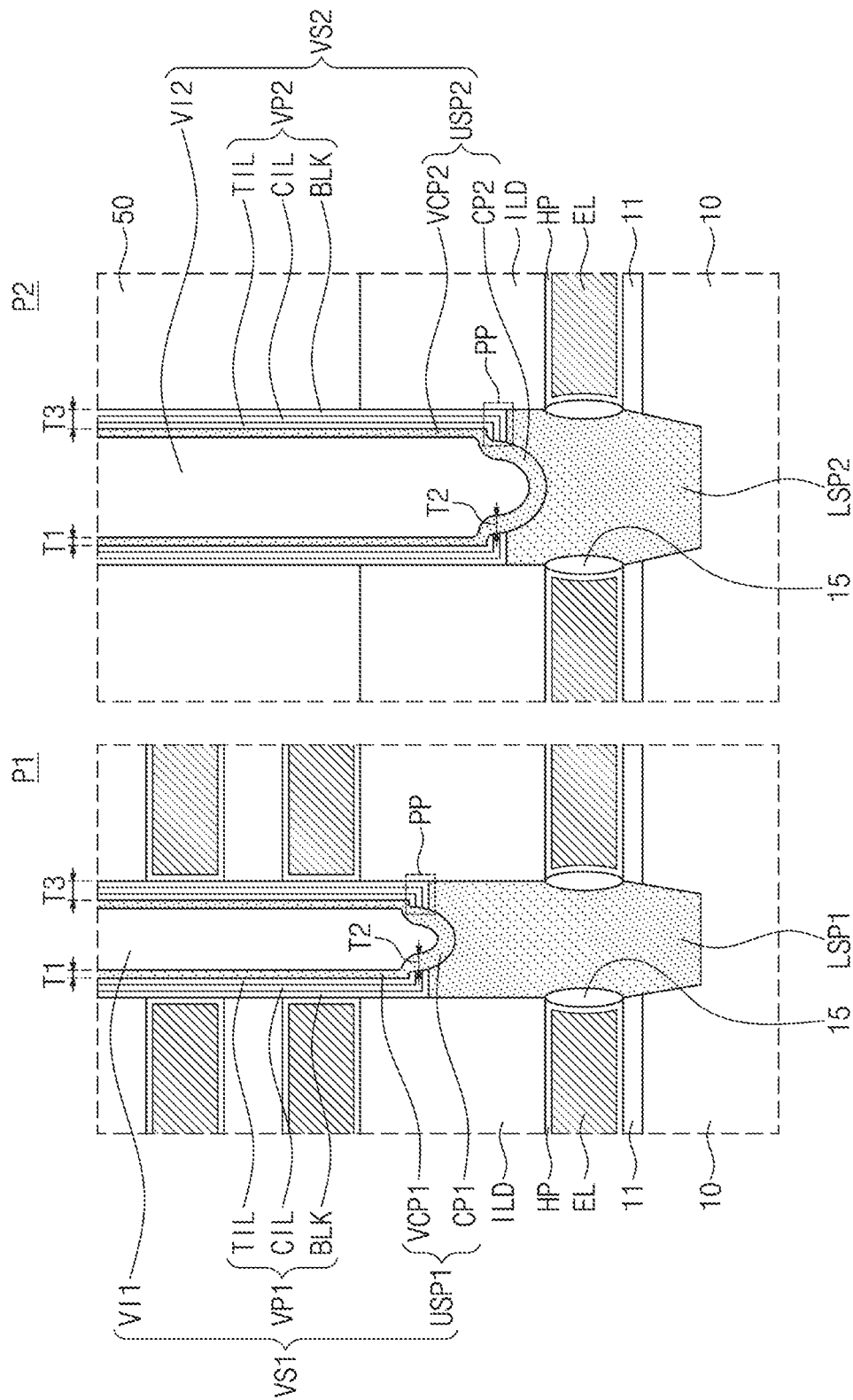
FIGS. 4A, 4B, 4C, 4D and 4E are enlarged views of portions 'P1' and 'P2' of FIG. 3 to illustrate portions of 3D semiconductor memory devices according to some embodiments of the inventive concepts.

Referring to FIGS. 3 and 4A, the first and second lower semiconductor patterns LSP1 and LSP2 may penetrate a lower portion of the electrode structure ST, e.g., a lowermost electrode EL.

The first lower semiconductor pattern LSP1 may have a first height H1 in the third direction D3 and may have a first width W1. The first height H1 of the first lower semiconductor pattern LSP1 may be greater than a thickness of the lowermost electrode EL. A top surface of the first lower semiconductor pattern LSP1 may be higher than a top surface of the lowermost electrode EL and may be lower than a top surface of a lowermost insulating layer ILD disposed on the lowermost electrode EL.

The second lower semiconductor pattern LSP2 may have a second height H2 in the third direction D3, and the second height H2 may be less than the first height H1 of the first lower semiconductor pattern LSP1. The second lower semiconductor pattern LSP2 may have a second width W2 greater than the first width W1 of the first lower semiconductor pattern LSP1. A top surface of the second lower semiconductor pattern LSP2 may be disposed at a higher level than the top surface of the lowermost electrode EL of the electrode structure ST. Alternatively, the top surface of the second lower semiconductor pattern LSP2 may be disposed at a lower level than the top surface of the lowermost electrode EL of the electrode structure ST. In certain embodiments, the heights of the second lower semiconductor patterns LSP2 may sequentially decrease as a horizontal distance from the cell array region CAR increases.

A gate insulating layer 15 may be disposed on a sidewall of each of the first and second lower semiconductor patterns LSP1 and LSP2. The gate insulating layer 15 may be disposed between the lowermost electrode EL and each of the first and second lower semiconductor patterns LSP1 and LSP2. The gate insulating layer 15 may include a silicon oxide layer (e.g., a thermal oxide layer). The gate insulating layer 15 may have a rounded sidewall.

Referring to FIG. 4A, each of the first vertical structures VS1 may include a first vertical insulating pattern VP1, a first vertical semiconductor pattern USP1, and a first filling insulation pattern VI1. Each of the second vertical structures VS2 may include a second vertical insulating pattern VP2, a second vertical semiconductor pattern USP2, and a second filling insulation pattern VI2. The second vertical structures may be dummy vertical structures. Thus, the second vertical insulating pattern VP2, the second vertical semiconductor pattern USP2 and the second filling insulation pattern VI2 may be a dummy vertical insulating pattern, a dummy vertical semiconductor pattern and a dummy filling insulation pattern, respectively.

The first vertical insulating pattern VP1 may be disposed between the electrode structure ST and the first vertical semiconductor pattern USP1 and may have a pipe or macaroni shape of which top and bottom ends are opened. In more detail, the first vertical insulating pattern VP1 may include a sidewall portion which extends in the third direction D3 to extend along or cover an inner sidewall of the electrode structure ST, and a protrusion PP which laterally extends or protrudes from the sidewall portion to extend along or cover a portion of the first lower semiconductor pattern LSP1.

The second vertical insulating pattern VP2 may be disposed between the electrode structure ST and the second vertical semiconductor pattern USP2 and may have a pipe or macaroni shape of which top and bottom ends are opened. Like the first vertical insulating pattern VP1, the second vertical insulating pattern VP2 may include a sidewall portion which extends in the third direction D3, and a protrusion PP which laterally extends or protrudes from the sidewall portion to extend along or cover a portion of the second lower semiconductor pattern LSP2.

The first and second vertical insulating patterns VP1 and VP2 may have a uniform thickness T3 on the inner sidewalls of the electrode structure ST. Each of the first and second vertical insulating patterns VP1 and VP2 may include a plurality of layers. In some embodiments, each of the first and second vertical insulating patterns VP1 and VP2 may include a data storage element of the 3D semiconductor memory device. For example, each of the first and second vertical insulating patterns VP1 and VP2 may be a data storage layer of a NAND flash memory device and may include a tunnel insulating layer TIL, a charge storage layer CIL, and a blocking insulating layer BLK. Alternatively, each of the first and second vertical insulating patterns VP1 and VP2 may include a thin layer for a phase-change memory cell or a thin layer for a variable resistance memory cell.

In some embodiments, the tunnel insulating layer TIL may be in direct contact with each of the first and second vertical semiconductor patterns USP1 and USP2, and the charge storage layer CIL may be disposed between the tunnel insulating layer TIL and the blocking insulating layer BLK. For example, the charge storage layer CIL may include a trap insulating layer, a floating gate electrode, and/or an insulating layer including conductive nano dots. In more detail, the charge storage layer CIL may include a silicon nitride layer, a silicon oxynitride layer, a silicon-rich nitride layer, a nano-crystalline silicon layer, and/or a laminated trap layer. The tunnel insulating layer TIL may include one or more materials having energy band gaps greater than that of the charge storage layer CIL, and the blocking insulating layer BLK may include a high-k dielectric layer such as an aluminum oxide layer or a hafnium oxide layer.

The first vertical semiconductor pattern USP1 may be in direct contact with the first lower semiconductor pattern LSP1 and may have a pipe shape having a closed bottom end or a U-shape. The first vertical semiconductor pattern USP1 may be in direct contact with an inner sidewall of the first vertical insulating pattern VP1. An inner space of the first vertical semiconductor pattern USP1 may be filled with the first filling insulation pattern VI1 including an insulating material.

The first vertical semiconductor pattern USP1 may be in an undoped state or may include a semiconductor material doped with dopants having the same conductivity type as the substrate 10. The first vertical semiconductor pattern USP1 may have a crystal structure different from that of the first lower semiconductor pattern LSP1. For example, the first vertical semiconductor pattern USP1 may have a single-crystalline structure, an amorphous structure, and/or a poly-crystalline structure.

A bottom surface of the first vertical semiconductor pattern USP1 may be disposed at a lower level than the top surface of the first lower semiconductor pattern LSP1. In other words, a portion of the top surface of the first lower semiconductor pattern LSP1 may be recessed, and a bottom portion of the first vertical semiconductor pattern USP1 may be disposed in the recessed region of the top surface of the first lower semiconductor pattern LSP1. In addition, the bottom surface of the first vertical semiconductor pattern USP1 may be disposed at a higher level than the top surface of the lowermost electrode EL.

In more detail, the first vertical semiconductor pattern USP1 may include a first vertical channel portion VCP1 which extends in the third direction D3 to extend along or cover the sidewall portion of the first vertical insulating pattern VP1, and a first contact portion CP1 which extends from the first vertical channel portion VCP1 and is in contact with the recessed portion of the top surface of the first lower semiconductor pattern LSP1. Here, the first vertical channel portion VCP1 may be disposed on a top surface of the protrusion PP of the first vertical insulating pattern VP1, and the first contact portion CP1 may cover a sidewall of the protrusion PP of the first vertical insulating pattern VP1. The first vertical channel portion VCP1 may have a first thickness T1 in a horizontal direction on the sidewall portion of the first vertical insulating pattern VP1, and the first contact portion CP1 may have a second thickness T2 in the horizontal direction on the sidewall of the protrusion PP of the first vertical insulating pattern VP1. Here, the second thickness T2 may be greater than the first thickness T1. The first thickness T1 of the first vertical channel portion VCP1 may be less than the thickness T3 of the first vertical insulating pattern VP1.

In some embodiments described herein, since the first vertical semiconductor pattern USP1 includes the first contact portion CP1 thicker than the first vertical channel portion VCP1 (i.e., T2>T1), it is possible to prevent the first vertical semiconductor pattern USP1 from being broken or otherwise avoid discontinuities in portions of the first vertical semiconductor pattern USP1 at regions on or covering the protrusion PP of the first vertical insulating pattern VP1. In addition, since the first thickness T1 of the first vertical channel portion VCP1 of the first vertical semiconductor pattern USP1 is less than the thickness T3 of the first vertical insulating pattern VP1, a grain boundary may be reduced in the first vertical semiconductor pattern USP1 formed of the semiconductor material. Thus, a current flow may be improved in the first vertical semiconductor pattern USP1 used as a channel in operation of the 3D semiconductor memory device.

The second vertical semiconductor pattern USP2 may be in direct contact with the second lower semiconductor pattern LSP2 and may have a pipe shape having a closed bottom end or a U-shape. The second vertical semiconductor pattern USP2 may be in direct contact with an inner sidewall of the second vertical insulating pattern VP2. An inner space of the second vertical semiconductor pattern USP2 may be filled with the second filling insulation pattern VI2 including an insulating material. A bottom surface of the second filling insulation pattern VI2 may be disposed at a lower level than a bottom surface of the second vertical insulating pattern VP2 or the top surface of the second lower semiconductor pattern LSP2. In some embodiments, a width of the second filling insulation pattern VI2 may be greater than a width of the first filling insulation pattern VI1.

The second vertical semiconductor pattern USP2 may include the same semiconductor material as the first vertical semiconductor pattern USP1. A bottom surface of the second vertical semiconductor pattern USP2 may be disposed at a lower level than the bottom surface of the first vertical semiconductor pattern USP1 and may be disposed at a lower level than the top surface of the second lower semiconductor pattern LSP2. In other words, a portion of the top surface of the second lower semiconductor pattern LSP2 may be recessed, and a bottom portion of the second vertical semiconductor pattern USP2 may be disposed in the recessed region of the top surface of the second lower semiconductor pattern LSP2.

In more detail, the second vertical semiconductor pattern USP2 may include a second vertical channel portion VCP2 which extends in the third direction D3 to extend along or cover the sidewall portion of the second vertical insulating pattern VP2, and a second contact portion CP2 which extends from the second vertical channel portion VCP2 and is in contact with the recessed portion of the top surface of the second lower semiconductor pattern LSP2. In some embodiments, a thickness T1 of the second vertical channel portion VCP2 of the second vertical semiconductor pattern USP2 may be substantially equal to the first thickness T1 of the first vertical channel portion VCP1 of the first vertical semiconductor pattern USP1. Likewise, a thickness T2 of the second contact portion CP2 of the second vertical semiconductor pattern USP2 may be substantially equal to the second thickness T2 of the first contact portion CP1 of the first vertical semiconductor pattern USP1. In addition, the thickness T1 of the second vertical channel portion VCP2 may be less than the thickness T3 of the second vertical insulating pattern VP2.

Figure 4B:
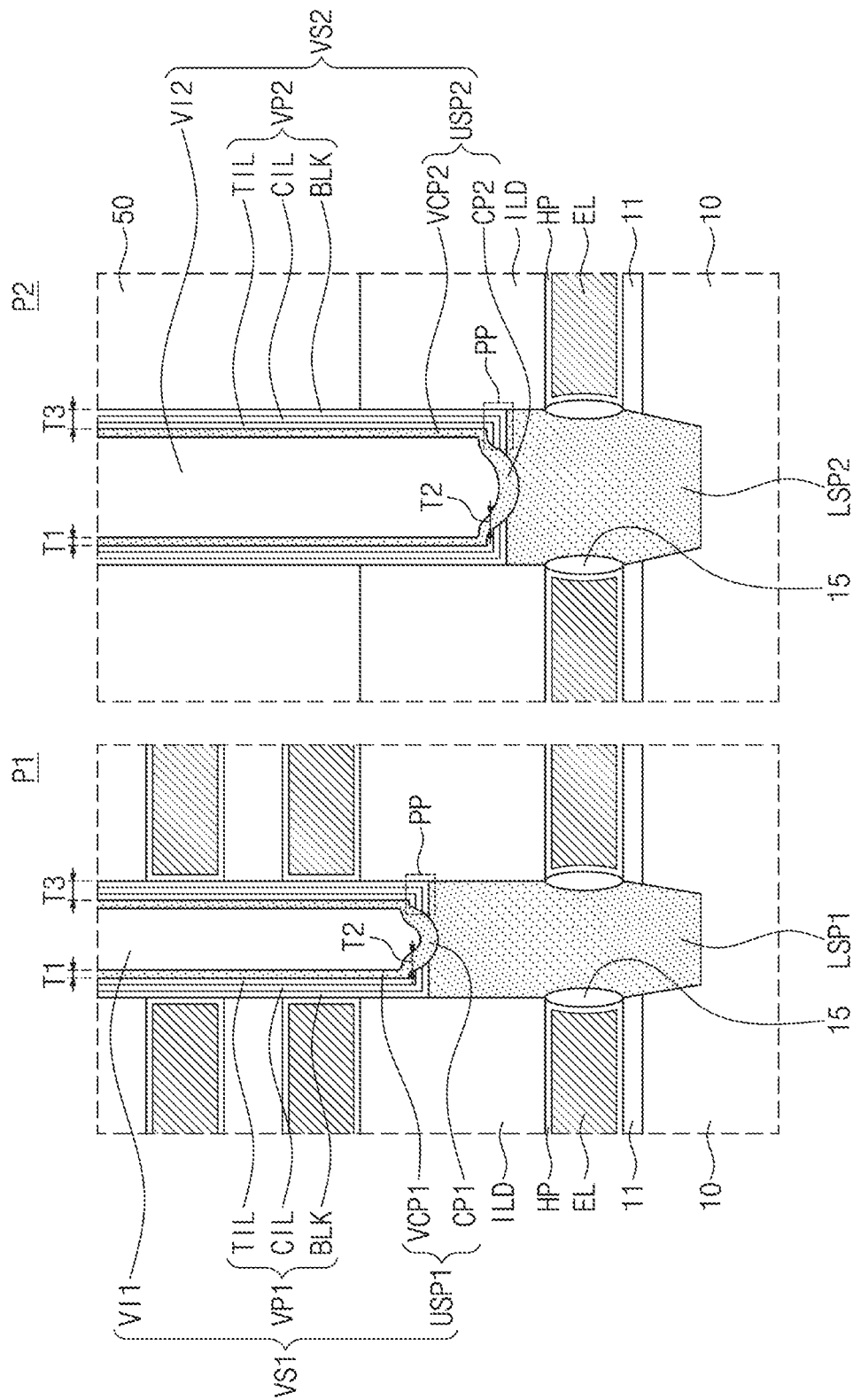

According to embodiments illustrated in FIGS. 4A and 4B, the first and second vertical semiconductor patterns USP1 and USP2 may have rounded bottom surfaces. The first and second contact portions CP1 and CP2 of the first and second vertical semiconductor patterns USP1 and USP2 may uniformly cover the top surfaces (e.g., the recessed portions) of the first and second lower semiconductor patterns LSP1 and LSP2 and may have the second thickness T2 on the top surfaces of the first and second lower semiconductor patterns LSP1 and LSP2. In addition, each of the first and second filling insulation patterns VI1 and VI2 may include a lower portion covering each of the first and second contact portions CP1 and CP2 and an upper portion covering each of the first and second vertical channel portions VCP1 and VCP2, and a width of the lower portion may be less than a width of the upper portion.

Meanwhile, according to the embodiment of FIG. 4A, the bottom surface of the first filling insulation pattern VI1 may be disposed at a lower level than the bottom surface of the first vertical insulating pattern VP1 or the top surface (e.g., a non-recessed portion of the top surface) of the first lower semiconductor pattern LSP1. Likewise, the bottom surface of the second filling insulation pattern VI2 may be disposed at a lower level than the bottom surface of the second vertical insulating pattern VP2 or the top surface (e.g., a non-recessed portion of the top surface) of the second lower semiconductor pattern LSP2. On the other hand, according to the embodiment of FIG. 4B, the bottom surface (e.g., the lowest point) of the first filling insulation pattern VI1 may be disposed at a higher level than the bottom surface of the first vertical insulating pattern VP1. Likewise, the bottom surface (e.g., the lowest point) of the second filling insulation pattern VI2 may be disposed at a higher level than the bottom surface of the second vertical insulating pattern VP2.

Figure 4C:
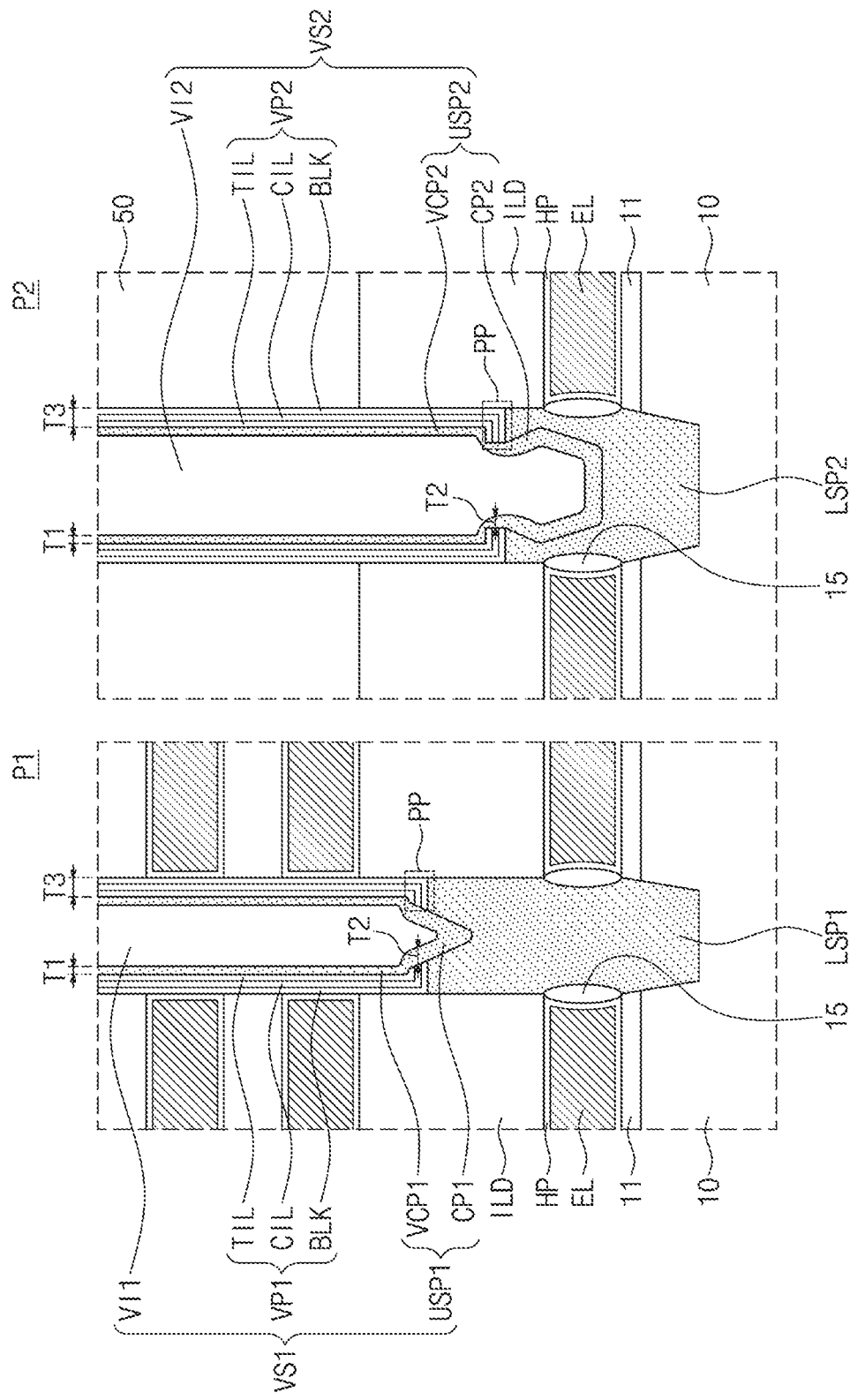

According to an embodiment of FIG. 4C, the first lower semiconductor pattern LSP1 may have a first recess region defined by sidewalls inclined with respect to the top surface of the substrate 10. The first contact portion CP1 of the first vertical semiconductor pattern USP1 may conformally cover an inner surface (e.g., the sidewalls) of the first recess region of the first lower semiconductor pattern LSP1 and may have the second thickness T2 on the inner surface of the recess region. The first contact portion CP1 of the first vertical semiconductor pattern USP1 may have a wedge shape.

The second lower semiconductor pattern LSP2 may have a second recess region defined by sidewalls inclined with respect to the top surface of the substrate 10. Here, a maximum width of the second recess region may be greater than a maximum width of the first recess region. The second recess region may have a substantially hexagonal shape (or a substantially sigma shape). The second contact portion CP2 of the second vertical semiconductor pattern USP2 may conformally cover an inner surface (e.g., the sidewalls) of the second recess region of the second lower semiconductor pattern LSP2 and may have the second thickness T2 on the inner surface of the second recess region. In addition, the second contact portion CP2 may include a portion laterally protruding toward the lowermost electrode EL beyond a sidewall of the protruding portion PP. The bottom surface of the second filling insulation pattern VI2 may be lower than the top surface of the lowermost electrode EL.

Figure 4D:
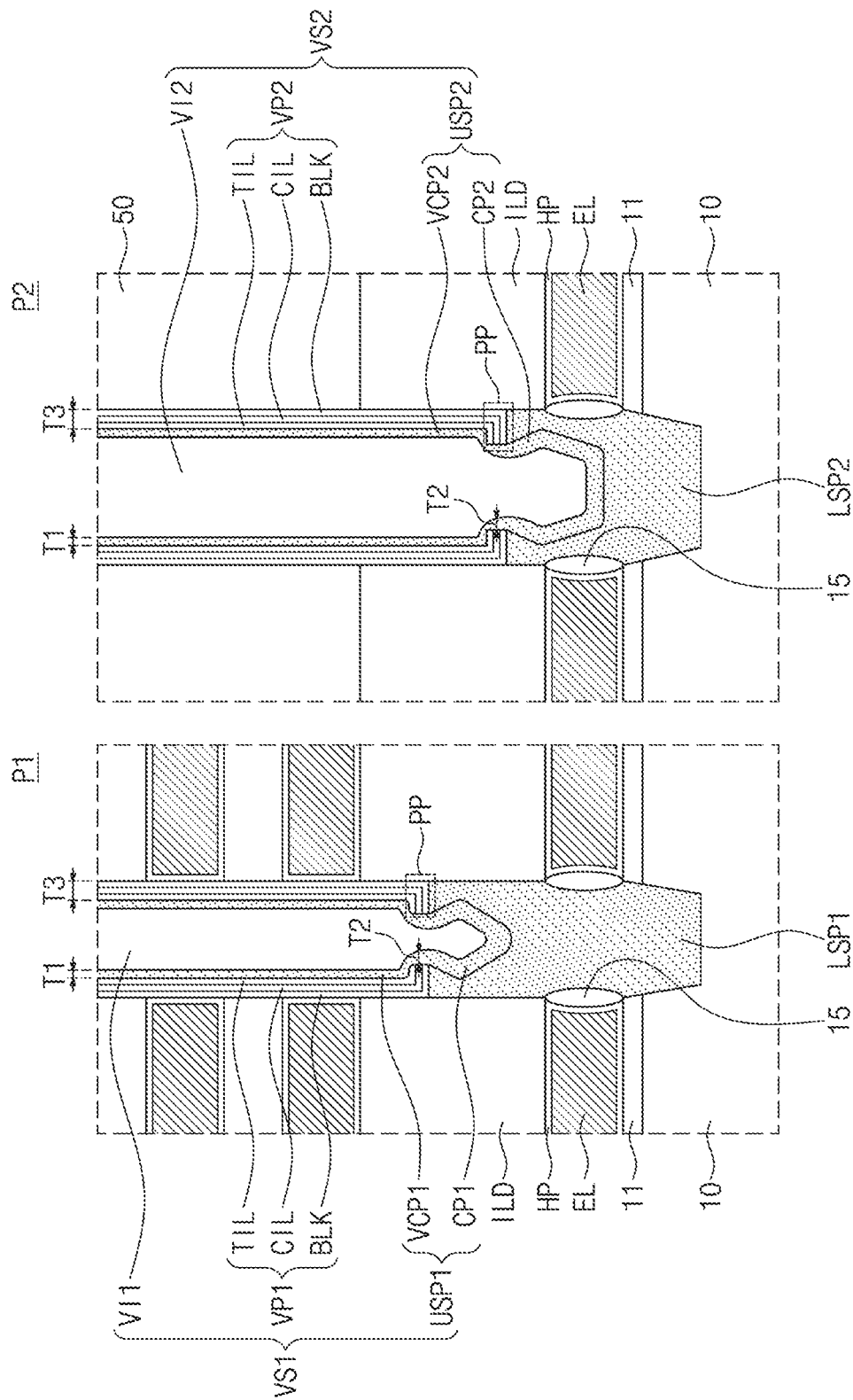

According to an embodiment of FIG. 4D, the first lower semiconductor pattern LSP1 may have a first recess region having a diamond shape, and the first contact portion CP1 of the first vertical semiconductor pattern USP1 may conformally cover an inner surface of the first recess region, and may include a portion laterally protruding beyond a sidewall of the protruding portion PP.

Figure 4E:
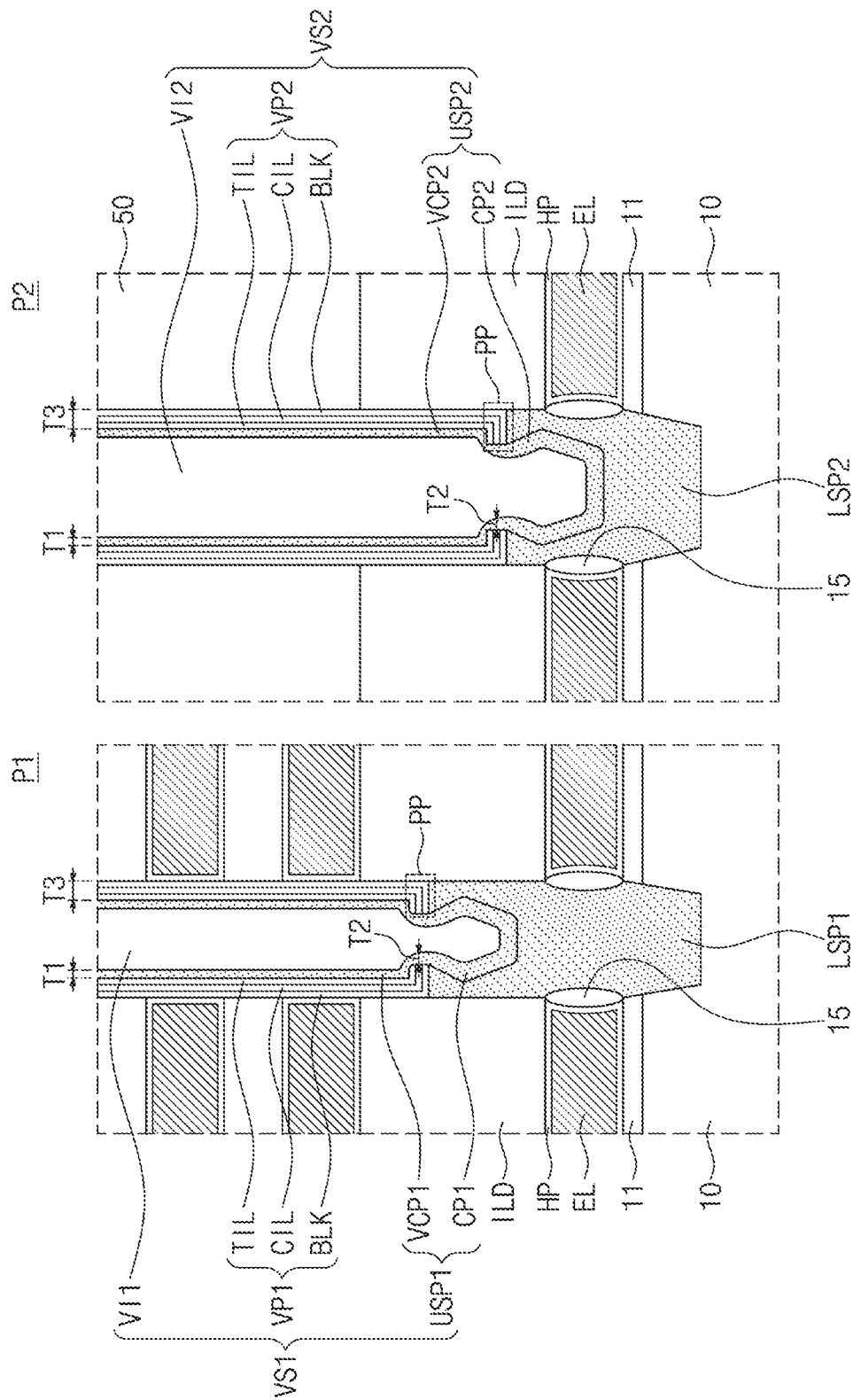

According to an embodiment of FIG. 4E, the first and second lower semiconductor patterns LSP1 and LSP2 may have first and second recess regions having substantially hexagonal shapes, respectively. The first contact portion CP1 of the first vertical semiconductor pattern USP1 may conformally cover an inner surface of the first recess region, and a portion of the first filling insulation pattern VI1 may fill the first recess region in which the first contact portion CP1 is formed. Likewise, the second contact portion CP2 of the second vertical semiconductor pattern USP2 may conformally cover an inner surface of the second recess region, and a portion of the second filling insulation pattern VI2 may fill the second recess region in which the second contact portion CP2 is formed.

Referring to FIGS. 4A to 4E, a horizontal insulating pattern HP may extend from between each of the electrodes EL and each of the first and second vertical structures VS1 and VS2 onto top and bottom surfaces of each of the electrodes EL. The horizontal insulating pattern HP adjacent to the lowermost electrode EL may extend from between the lowermost electrode EL and the gate insulating layer 15 of each of the first and second lower semiconductor patterns LSP1 and LSP2 onto top and bottom surfaces of the lowermost electrode EL. The horizontal insulating pattern HP may be a portion of the data storage layer of the NAND flash memory device. For example, the horizontal insulating pattern HP may include a charge storage layer and a blocking insulating layer. Alternatively, the horizontal insulating pattern HP may include at least a portion of the blocking insulating layer.

Referring again to FIGS. 2A and 3, common source regions CSR may be formed in the substrate 10 and may be doped with dopants of a second conductivity type. The common source regions CSR may extend in parallel to the electrode structures ST in the first direction D1. For example, the common source regions CSR may include N-type dopants (e.g., arsenic (As) or phosphorus (P)).

A common source plug CSP may be connected to the common source region CSR between subsets of the electrode structures ST. In some embodiments, the common source plug CSP may have a substantially uniform upper width and may extend in the first direction D1. Insulating spacers SP may be disposed between the common source plug CSP and the electrode structures ST. Alternatively, the insulating spacer SP may fill a space between subsets of the electrode structures ST, and the common source plug CSP may penetrate the insulating spacer SP so as to be locally connected to the common source region CSR.

A first interlayer insulating layer 60 may be disposed on the planarization insulating layer 50 and the electrode structure ST and may cover the top surfaces of the first vertical structures VS1 and the top surfaces of the second vertical structures VS2. A second interlayer insulating layer 70 may be disposed on the first interlayer insulating layer 60 and may cover top surfaces of the common source plugs CSP.

The cell contact plugs CPLG may penetrate the first and second interlayer insulating layers 60 and 70 and the planarization insulating layer 50 so as to be connected to the pad portions of the electrodes EL, respectively. Vertical lengths of the cell contact plugs CPLG may sequentially decrease as a horizontal distance from the cell array region CAR decreases. Top surfaces of the cell contact plugs CPLG may be substantially coplanar with each other. Each of the cell contact plugs CPLG may be surrounded by the second vertical structures VS2 when viewed in a plan view. In other words, each of the cell contact plugs CPLG may be disposed among the second vertical structures VS2 adjacent to each other.

Sub-bit lines SBL may be disposed on the second interlayer insulating layer 70 of the cell array region CAR and may be electrically connected to the first vertical structures VS1 through bit line contact plugs BPLG. Interconnection lines CL may be disposed on the second interlayer insulating layer 70 of the connection region CNR and may be connected to the cell contact plugs CPLG. A third interlayer insulating layer 80 may be disposed on the second interlayer insulating layer 70 and may cover the sub-bit lines SBL and the interconnection lines CL.

Bit lines BL may be disposed on the third interlayer insulating layer 80 and may extend in the second direction D2 to intersect the electrode structure ST. The bit lines BL may be connected to the sub-bit lines SBL through contact plugs CT.

Figure 5:
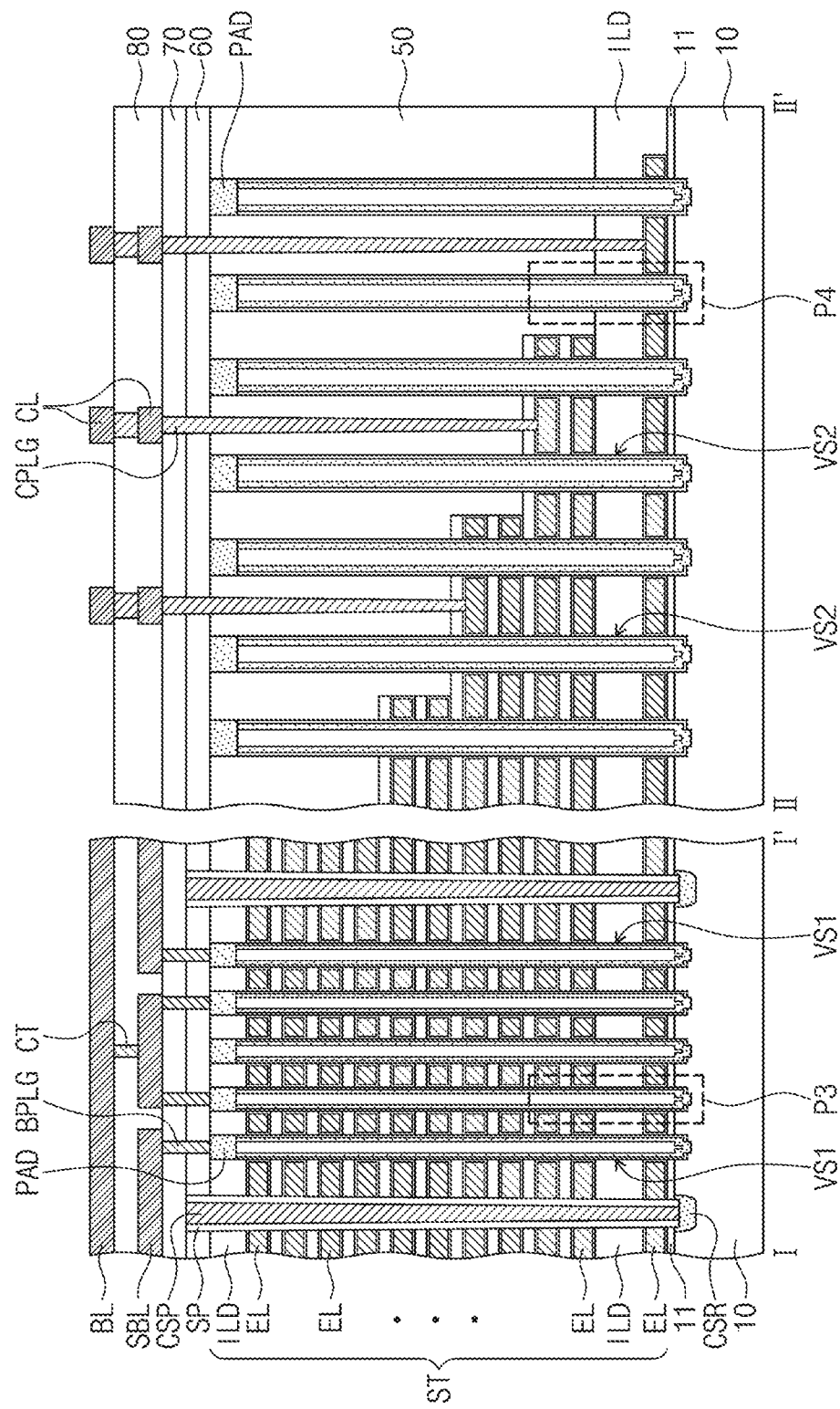
FIG. 5 is a cross-sectional view taken along lines I-I' and II-II' of FIG. 2A or 2B to illustrate a 3D semiconductor memory device according to some embodiments of the inventive concepts.
Figure 6:
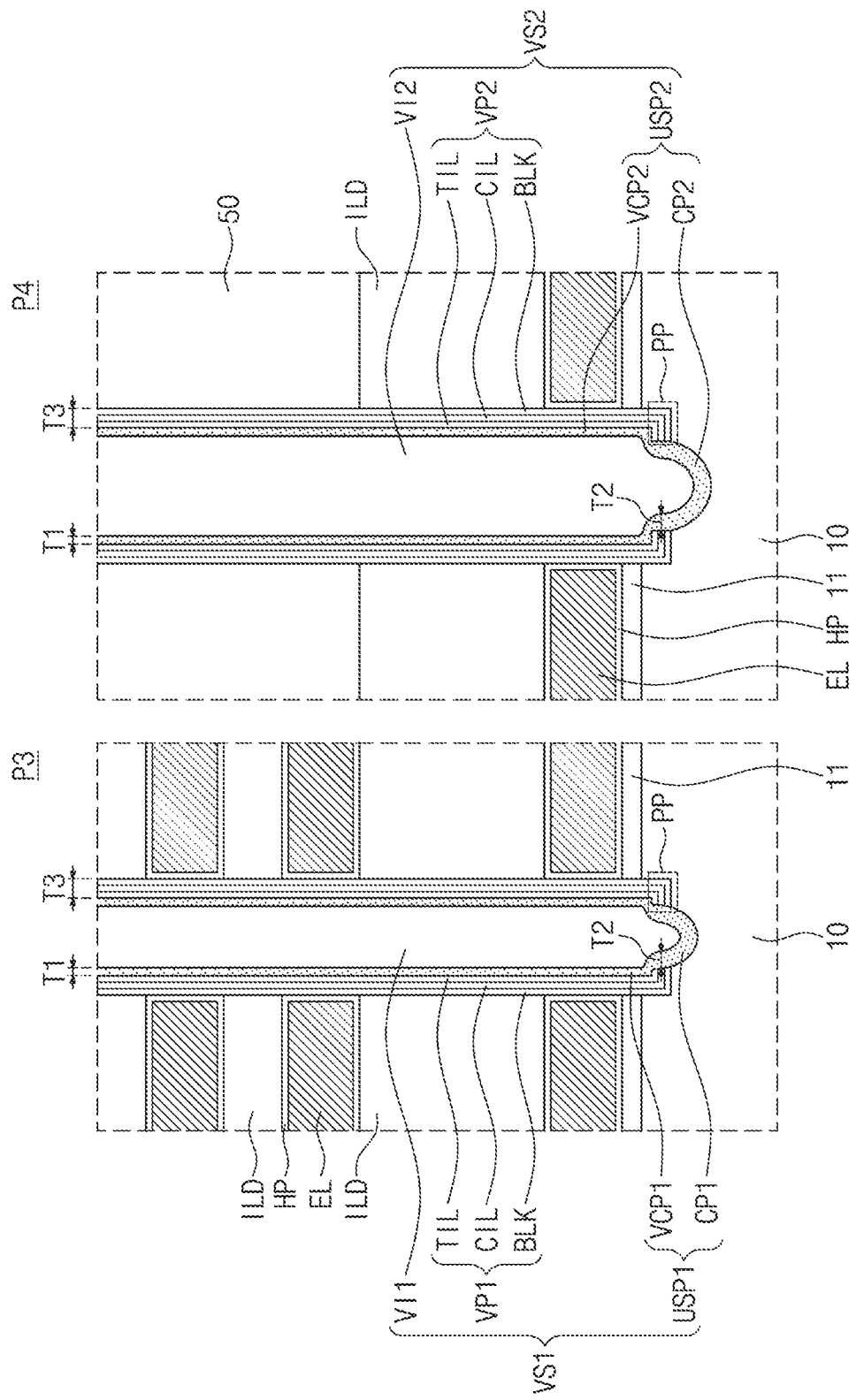
FIG. 6 illustrates enlarged views of portions 'P3' and 'P4' of FIG. 5.

FIG. 5 is a cross-sectional view taken along lines I-I' and II-II' of FIG. 2A or 2B to illustrate a 3D semiconductor memory device according to some embodiments of the inventive concepts. FIG. 6 illustrates enlarged views of portions 'P3' and 'P4' of FIG. 5.

In embodiments of FIGS. 5 and 6, the first and second lower semiconductor patterns LSP1 and LSP2 described with reference to FIGS. 2A, 2B and 3 may be omitted.

Each of first vertical structures VS1 may include a first vertical insulating pattern VP1, a first vertical semiconductor pattern USP1, and a first filling insulation pattern VI1. Each of second vertical structures VS2 may include a second vertical insulating pattern VP2, a second vertical semiconductor pattern USP2, and a second filling insulation pattern VI2.

As described above, each of the first and second vertical insulating patterns VP1 and VP2 may include a sidewall portion which extends in a vertical direction to extend along or cover an inner sidewall of the electrode structure ST, and a protrusion PP which laterally extends from a bottom portion of the sidewall portion to extend along or cover a portion of the top surface of the substrate 10. The first and second vertical semiconductor patterns USP1 and USP2 may include vertical channel portions VCP1 and VCP2 extending in the vertical direction and contact portions CP1 and CP2 being in direct contact with the top surface of the substrate 10, respectively. As described above, each of the vertical channel portions VCP1 and VCP2 may have a first thickness T1 less than a thickness T3 of each of the first and second vertical insulating patterns VP1 and VP2, and each of the contact portions CP1 and CP2 may have a second thickness T2 greater than the first thickness T1. Here, each of the contact portions CP1 and CP2 of the first and second vertical semiconductor patterns USP1 and USP2 may have one of various shapes as described above with reference to FIGS. 4A to 4E.

Figure 7:
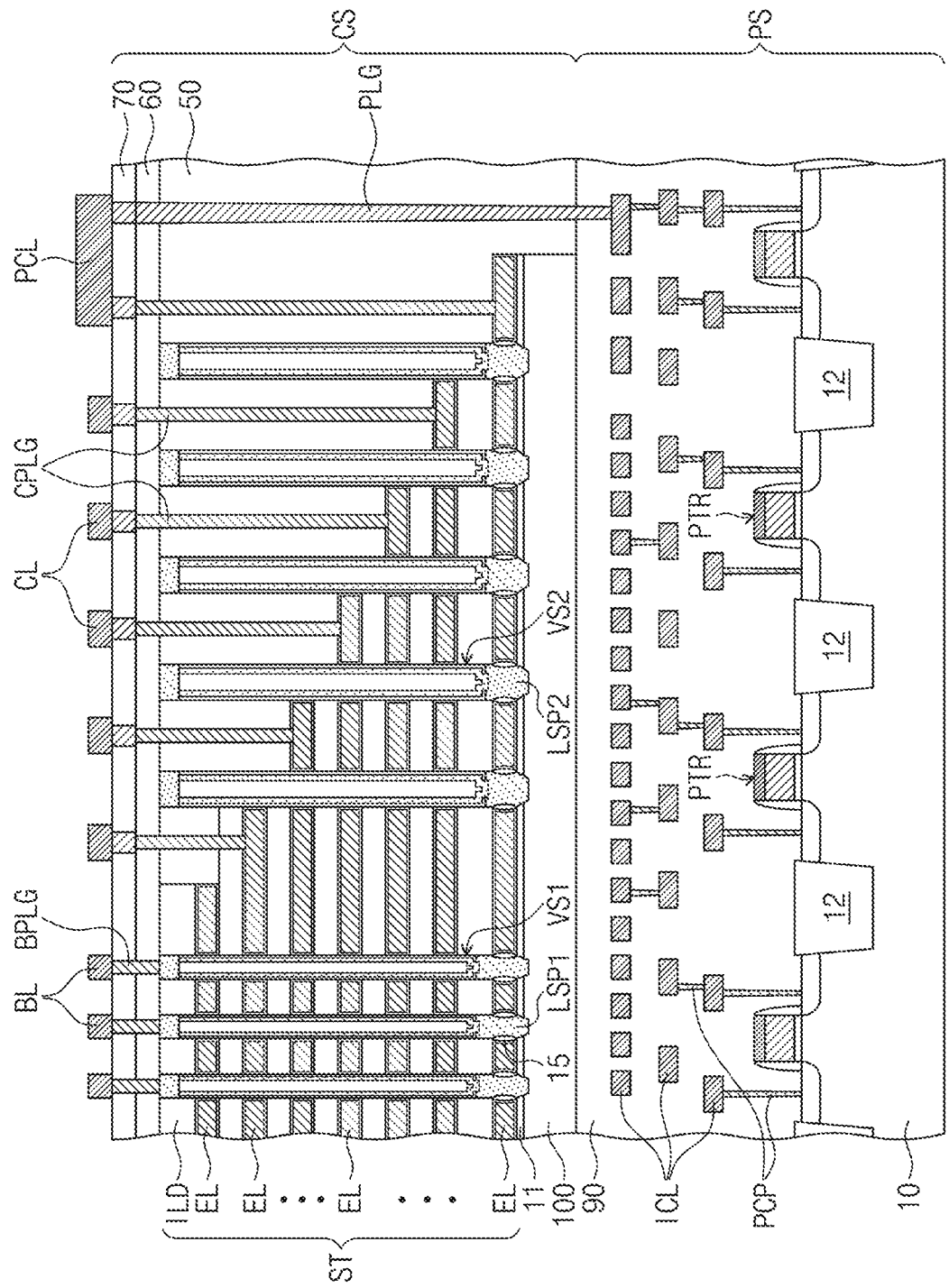
FIG. 7 is a cross-sectional view illustrating a 3D semiconductor memory device according to some embodiments of the inventive concepts.

FIG. 7 is a cross-sectional view illustrating a 3D semiconductor memory device according to some embodiments of the inventive concepts.

Referring to FIG. 7, a 3D semiconductor memory device may include a peripheral logic structure PS and a cell array structure CS stacked on the peripheral logic structure PS. In other words, the cell array structure CS may overlap with the peripheral logic structure PS when viewed in a plan view.

The peripheral logic structure PS may include peripheral circuits integrated on a substrate 10. The peripheral circuits may include high-voltage and low-voltage transistors, resistors, and/or capacitors. The substrate 10 may be a semiconductor substrate formed of a semiconductor material. The substrate 10 may include an N-well region doped with N-type dopants and a P-well region doped with P-type dopants. Active regions may be defined in the N-well region and the P-well region by a device isolation layer 12.

The peripheral logic structure PS may include peripheral transistors PTR on the substrate 10, peripheral circuit plugs PCP, peripheral circuit interconnection lines ICL, and a buried insulating layer 90 covering peripheral circuits including peripheral transistors PTR. Each of the peripheral transistors PTR may include a peripheral gate electrode and source and drain dopant regions at both sides of the peripheral gate electrode. The peripheral transistors may include PMOS transistors formed on the N-well region and NMOS transistors formed on the P-well region. The peripheral circuit interconnection lines ICL may be electrically connected to the peripheral circuits through the peripheral circuit plugs PCP. For example, the peripheral circuit plugs PCP and the peripheral circuit interconnection lines ICL may be electrically connected to the NMOS and PMOS transistors.

The buried insulating layer 90 may cover the peripheral circuits, the peripheral circuit plugs PCP, and the peripheral circuit interconnection lines ICL. The buried insulating layer 90 may include a plurality of stacked insulating layers.

The cell array structure CS may be disposed on the buried insulating layer 90 and may include a horizontal semiconductor layer 100, electrode structures ST, first and second lower semiconductor patterns LSP1 and LSP2, and first and second vertical structures VS1 and VS2.

The horizontal semiconductor layer 100 may be formed on a top surface of the buried insulating layer 90 covering the peripheral circuits. In other words, the horizontal semiconductor layer 100 may be in contact with the buried insulating layer 90. The horizontal semiconductor layer 100 may include a cell array region and a connection region adjacent to the cell array region, as described with reference to FIGS. 2A, 2B and 3.

The horizontal semiconductor layer 100 may be formed of a semiconductor material. For example, the horizontal semiconductor layer 100 may include silicon (Si), germanium (Ge), silicon-germanium (SiGe), gallium-arsenic (GaAs), indium-gallium-arsenic (InGaAs), and/or aluminum-gallium-arsenic (AlGaAs). The horizontal semiconductor layer 100 may include a semiconductor material doped with dopants of a first conductivity type and/or an intrinsic semiconductor material not doped with dopants. In addition, the horizontal semiconductor layer 100 may have a crystal structure including a single-crystalline structure, an amorphous structure, and/or a poly-crystalline structure.

The electrode structures ST, the first and second lower semiconductor patterns LSP1 and LSP2, the first and second vertical structures VS1 and VS2, the bit lines BL and the interconnection lines CL, described above, may be provided on the horizontal semiconductor layer 100.

The electrode structures ST may extend in parallel to each other along the first direction D1 on the horizontal semiconductor layer 100 and may be spaced apart from each other in the second direction D2, as described with reference to FIGS. 2A, 2B and 3. Each of the electrode structures ST may include electrodes EL vertically stacked on the horizontal semiconductor layer 100 and insulating layers ILD disposed between the electrodes EL. Each of the electrode structures ST may have a stepped structure on the connection region to electrically connect the electrodes EL to the peripheral logic structure PS, as described above. A planarization insulating layer 50 may be disposed on the horizontal semiconductor layer 100 to extend along or cover pad portions of the electrodes EL, which constitute the stepped structure. The first and second vertical structures VS1 and VS2 may have the technical features described with reference to FIGS. 4A to 4E.

An interconnection structure for electrically connecting the cell array structure CS to the peripheral logic structure PS may be disposed on the stepped structure of the electrode structure ST. The interconnection structure may include cell contact plugs CPLG penetrating the planarization insulating layer 50 so as to be connected to the pad portions of the electrodes EL, interconnection lines CL disposed on the planarization insulating layer 50 and connected to the cell contact plugs CPLG, and a connection contact plug PLG penetrating the planarization insulating layer 50 and the horizontal semiconductor layer 100 so as to be connected to the peripheral circuit interconnection line ICL of the peripheral logic structure PS.

FIGS. 8 to 14 are cross-sectional views taken along the lines I-I' and II-II' of FIG. 2A or 2B to illustrate a method for fabricating a 3D semiconductor memory device according to some embodiments of the inventive concepts.

Figure 8:
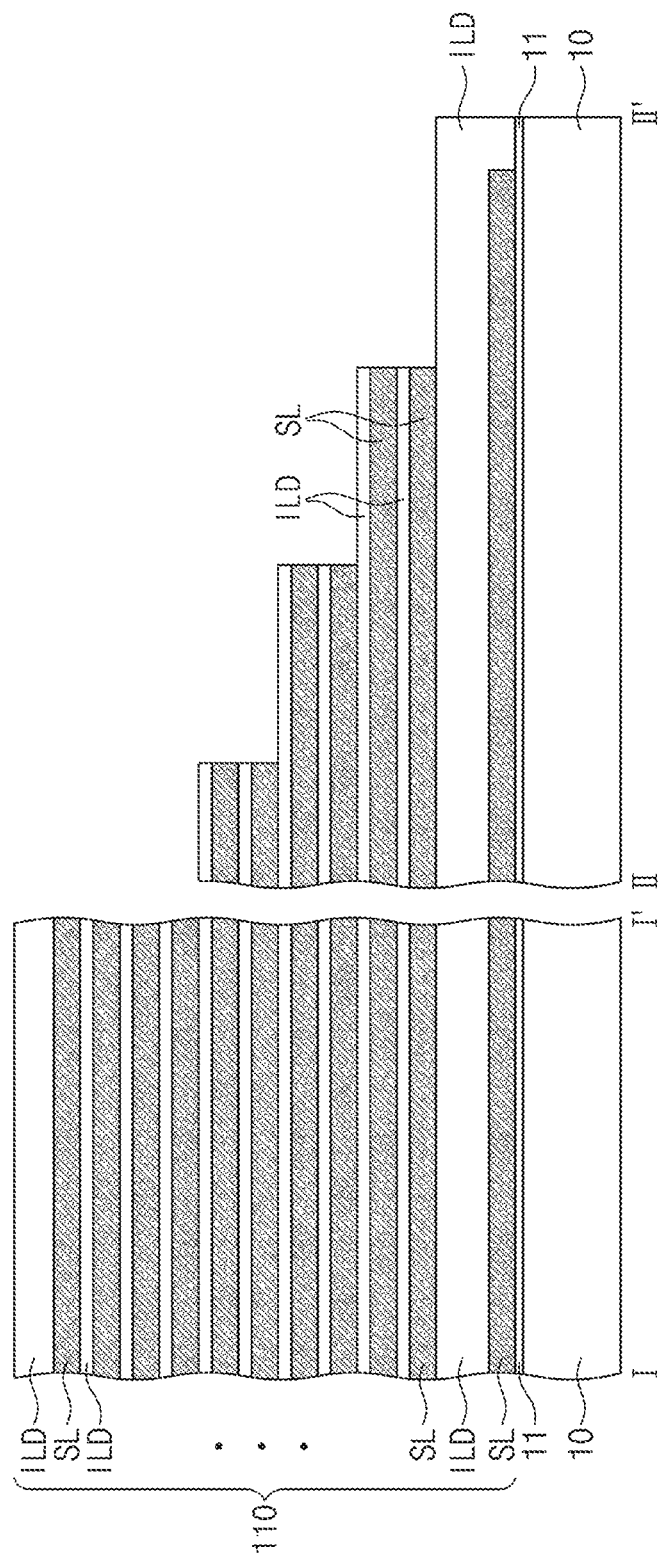
FIGS. 8 to 14 are cross-sectional views taken along the lines I-I' and II-II' of FIG. 2A or 2B to illustrate a method for fabricating a 3D semiconductor memory device according to some embodiments of the inventive concepts.

Referring to FIGS. 2A and 8, a mold structure 110 may be formed on a substrate 10. The mold structure 110 may include sacrificial layers SL and insulating layers ILD which are vertically and alternately stacked. The mold structure 110 may extend from a cell array region CAR onto a connection region CNR of the substrate 10.

In the mold structure 110, the sacrificial layers SL may be formed of a material having an etch selectivity with respect to the insulating layers ILD. For example, the sacrificial layers SL may be formed of a different insulating material from that of the insulating layers ILD. For example, each of the sacrificial layers SL may be formed of a silicon nitride layer, and each of the insulating layers ILD may be formed of a silicon oxide layer. Thicknesses of the sacrificial layers SL may be substantially equal to each other, and a thickness of at least one of the insulating layers ILD may be different from that (those) of other(s) of the insulating layers ILD.

The formation of the mold structure 110 may include forming a thin-layer structure including the sacrificial layers SL and the insulating layers ILD alternately stacked on an entire top surface of the substrate 10, and performing a trimming process on the thin-layer structure. The trimming process may include a process of forming a mask pattern (not shown) covering the thin-layer structure on the cell array region CAR and the connection region CNR, a process of etching a portion of the thin-layer structure, and a process of reducing a planar area of the mask pattern. Here, the process of etching a portion of the thin-layer structure and the process of reducing a planar area of the mask pattern may be alternately repeated. The mold structure 110 may have a stepped structure on the connection region CNR by the trimming process.

Figure 9:
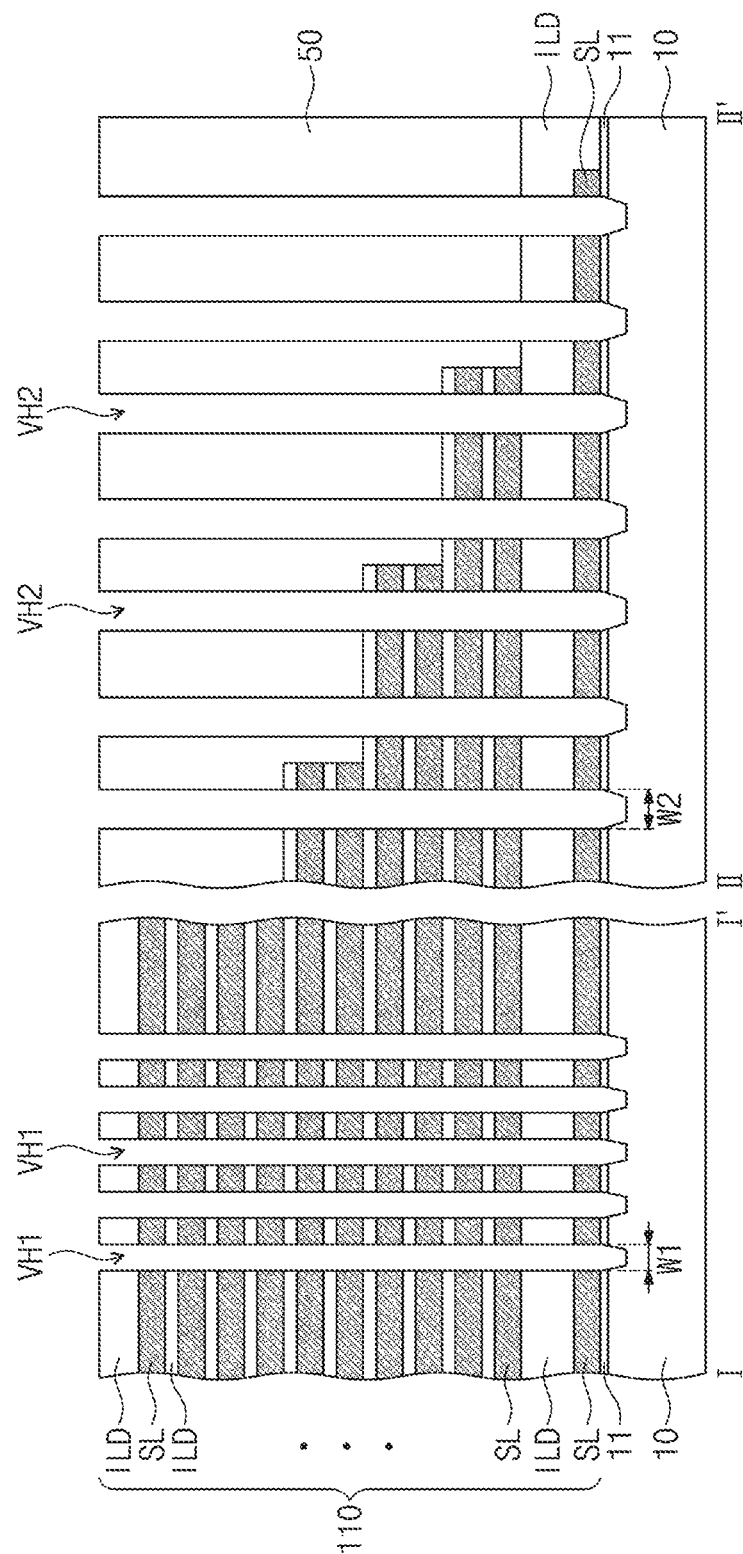

Referring to FIGS. 2A and 9, a planarization insulating layer 50 may be formed on the substrate 10 after the formation of the mold structure 110. The planarization insulating layer 50 may be formed of an insulating material having an etch selectivity with respect to the sacrificial layers SL. A filling insulation layer thicker than the mold structure 110 may be formed on an entire top surface of the substrate 10, and then, a planarization process (e.g., a chemical mechanical polishing (CMP) process) may be performed on the filling insulation layer to form the planarization insulating layer 50.

After the formation of the planarization insulating layer 50, first vertical holes VH1 may be formed to penetrate the mold structure 110 on the cell array region CAR, and second vertical holes VH2 may be formed to penetrate the planarization insulating layer 50 and the mold structure 110 on the connection region CNR.

The formation of the first and second vertical holes VH1 and VH2 may include forming a mask pattern (not shown) on the mold structure 110 and the planarization insulating layer 50, and anisotropically etching the mold structure 110 and the planarization insulating layer 50 by using the mask pattern (not shown) as an etch mask. The first and second vertical holes VH1 and VH2 may expose inner sidewalls of the mold structure 110, and at least some of the second vertical holes VH2 may expose portions of the planarization insulating layer 50. In the anisotropic etching process of forming the first and second vertical holes VH1 and VH2, the top surface of the substrate 10 may be etched by over-etching, and thus the top surface of the substrate 10 exposed by the first and second vertical holes VH1 and VH2 may be recessed by a predetermined depth.

The first vertical holes VH1 may be arranged in a matrix form or in a zigzag form when viewed in a plan view. In some embodiments, the second vertical holes VH2 may be arranged in a direction in a plan view and may penetrate end portions of the sacrificial layers SL on the connection region CNR. Each of the first vertical holes VH1 may have a first width W1, and each of the second vertical holes VH2 may have a second width W2 greater than the first width W1. In some embodiments, each of the first and second vertical holes VH1 and VH2 may be tapered to have a lower width less than an upper width thereof.

Figure 10:
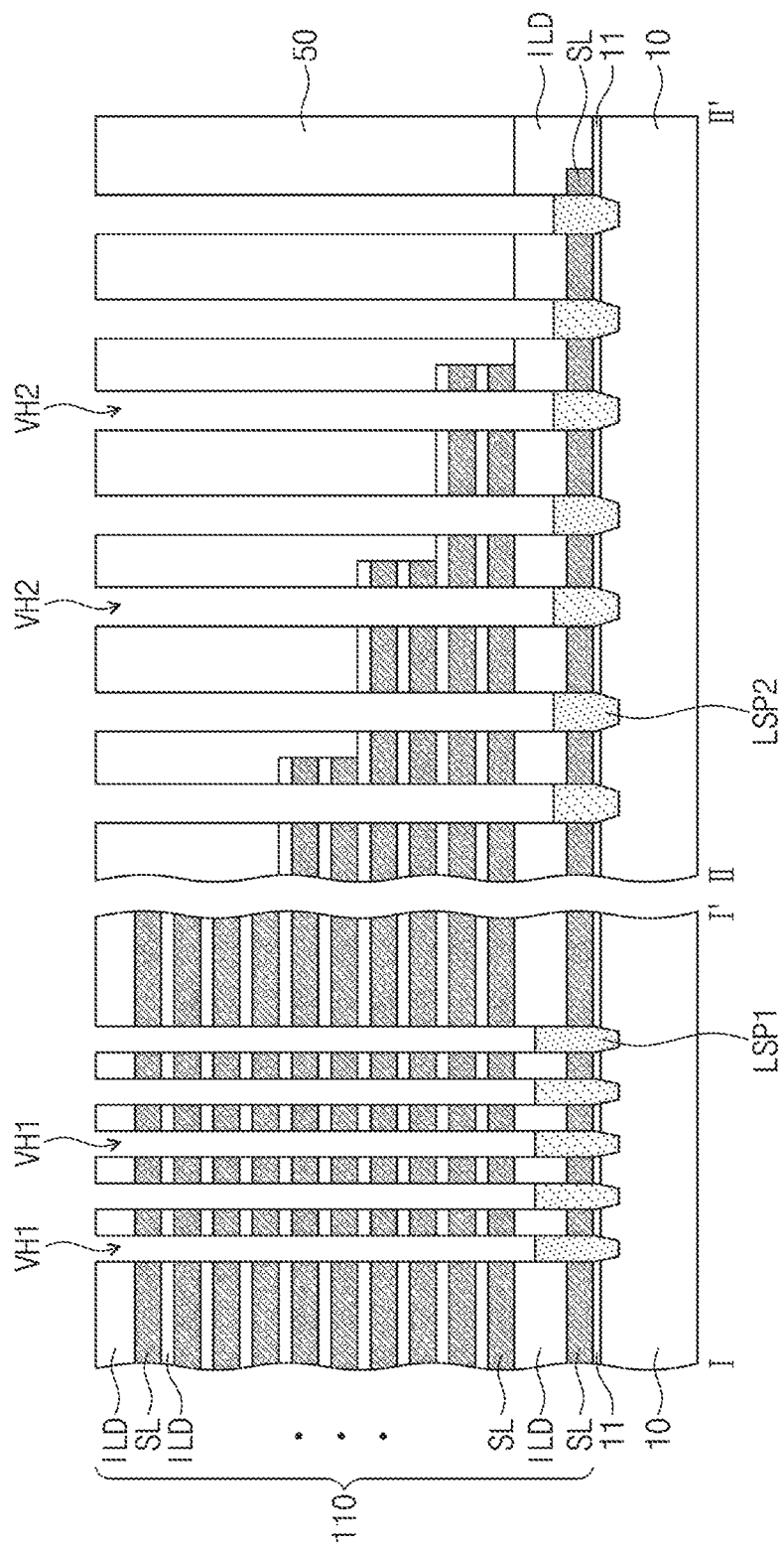

Referring to FIGS. 2A and 10, first and second lower semiconductor patterns LSP1 and LSP2 may be formed to fill lower regions of the first and second vertical holes VH1 and VH2, respectively.

The first and second lower semiconductor patterns LSP1 and LSP2 may be formed by performing a selective epitaxial growth (SEG) process using the substrate 10, exposed by the first and second vertical holes VH1 and VH2, as a seed layer. Thus, the first and second lower semiconductor patterns LSP1 and LSP2 may have pillar shapes filling the lower regions of the first and second vertical holes VH1 and VH2, and widths of the second lower semiconductor patterns LSP2 may be greater than widths of the first lower semiconductor patterns LSP1.

In some embodiments, during the SEG process, impurity gases (e.g., hydrogen, carbon, and/or nitrogen) may be generated from the planarization insulating layer 50 and may be discharged through the second vertical holes VH2. The impurity gases may inhibit the second lower semiconductor patterns LSP2 from being grown in the lower regions of the second vertical holes VH2. Thus, heights of the second lower semiconductor patterns LSP2 may be less than heights of the first lower semiconductor patterns LSP1 relative to the substrate 10.

In addition, since a thickness of the planarization insulating layer 50 on the connection region CNR increases as a horizontal distance from the cell array region CAR increases, the amount of the impurity gases discharged through the second vertical holes VH2 in the SEG process may increase as a horizontal distance from the cell array region CAR increases. Thus, the heights of the second lower semiconductor patterns LSP2 may sequentially decrease as a horizontal distance from the cell array region CAR increases.

Since the first and second lower semiconductor patterns LSP1 and LSP2 are formed at the same time, they may be formed of the same semiconductor material. The semiconductor material of the first and second lower semiconductor patterns LSP1 and LSP2 may be silicon. However, embodiments of the inventive concepts are not limited thereto. In certain embodiments, the first and second lower semiconductor patterns LSP1 and LSP2 may be formed of a carbon nano-structure, an organic semiconductor material, or a compound semiconductor material.

Top surfaces of the first lower semiconductor patterns LSP1 may be higher than a top surface of a lowermost sacrificial layer SL, and a portion of a sidewall of each of the first lower semiconductor patterns LSP1 may be in direct contact with the lowermost sacrificial layer SL. Top surfaces of the second lower semiconductor patterns LSP2 may be higher than the top surface of the lowermost sacrificial layer SL, and a portion of a sidewall of each of the second lower semiconductor patterns LSP2 may be in direct contact with the lowermost sacrificial layer SL. Alternatively, the top surface of at least one of the second lower semiconductor patterns LSP2 may be lower than the top surface of the lowermost sacrificial layer SL, and a portion of a sidewall of the lowermost sacrificial layer SL may be in direct contact with the second lower semiconductor pattern LSP2.

Figure 11:
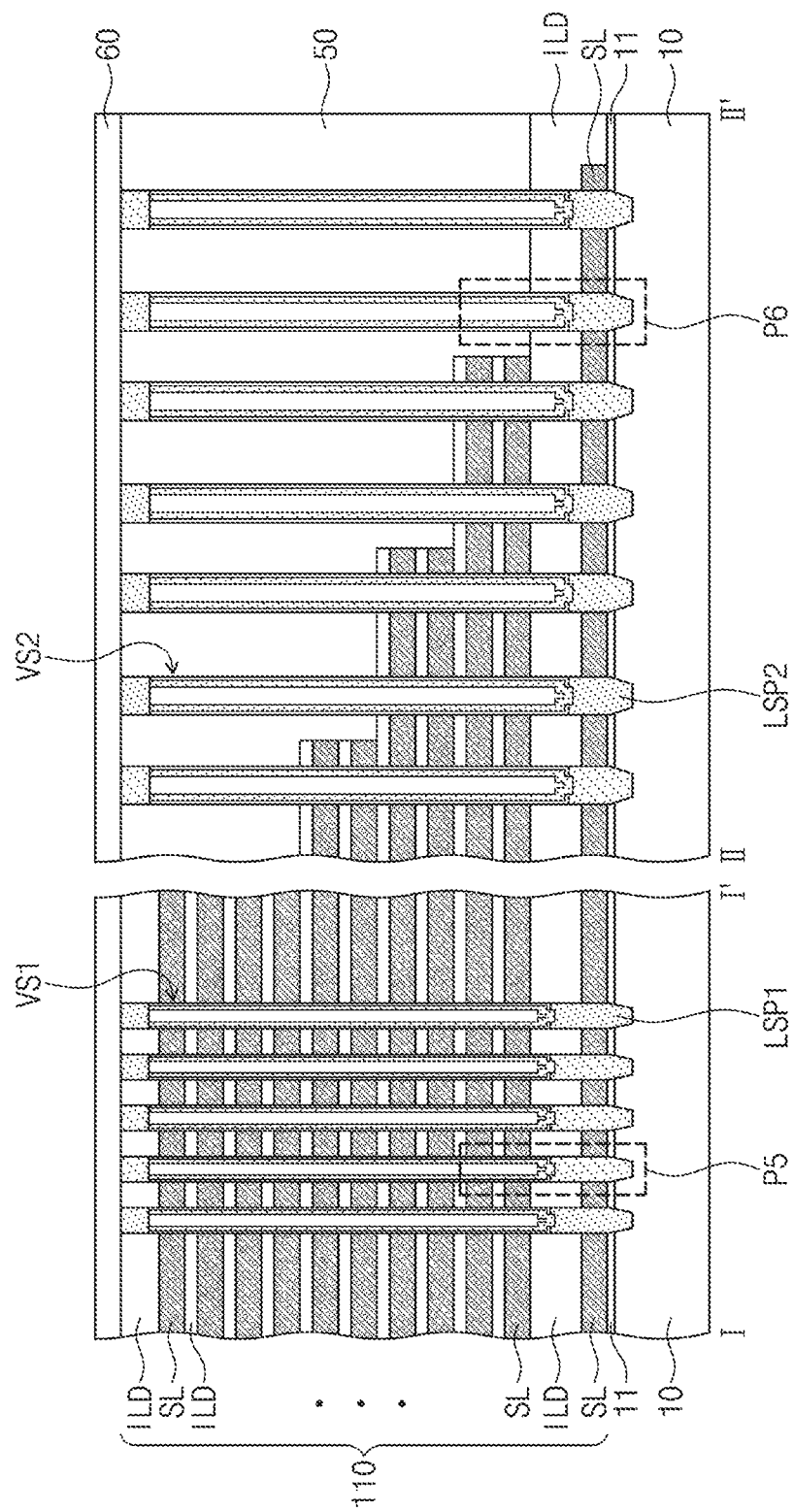

Referring to FIGS. 2A and 11, first and second vertical structures VS1 and VS2 may be formed in the first and second vertical holes VH1 and VH2 in which the first and second lower semiconductor patterns LSP1 and LSP2 are formed.

Each of the first vertical structures VS1 may include a first vertical insulating pattern VP1, a first vertical semiconductor pattern USP1, and a first filling insulation pattern VI1. Each of the second vertical structures VS2 may include a second vertical insulating pattern VP2, a second vertical semiconductor pattern USP2, and a second filling insulation pattern VI2. The method of forming the first and second vertical structures VS1 and VS2 will be described later in more detail with reference to FIGS. 15 to 18, 20 and 21. Conductive pads PAD may be formed on top ends of the first and second vertical semiconductor patterns USP1 and USP2, respectively. The conductive pads PAD may be dopant regions doped with dopants or may be formed of a conductive material.

After the formation of the first and second vertical structures VS1 and VS2, a first interlayer insulating layer 60 may be formed on the planarization insulating layer 50 and the mold structure 110 and may cover top surfaces of the first and second vertical structures VS1 and VS2.

Figure 12:
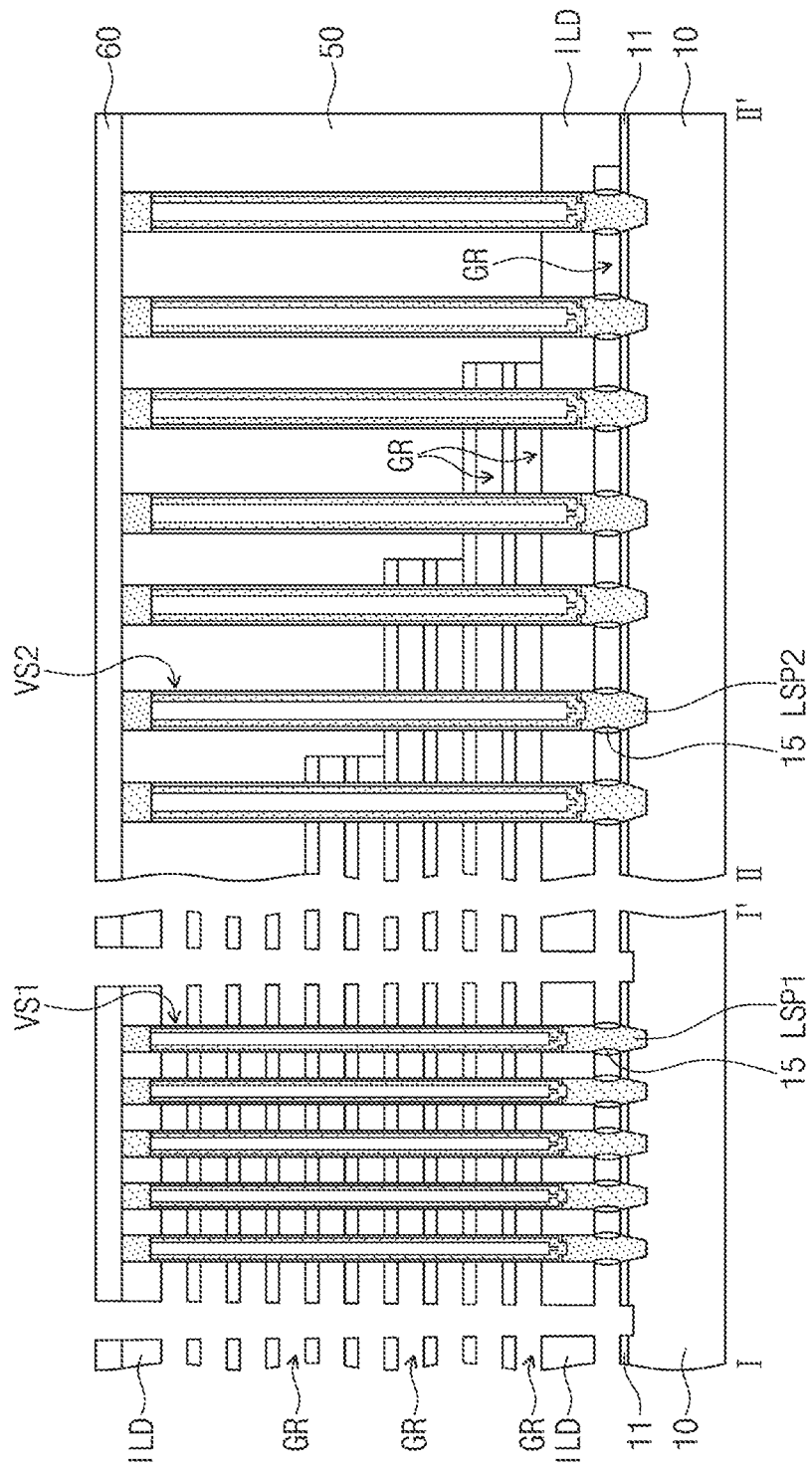

Referring to FIGS. 2A and 12, a process of replacing the sacrificial layers SL with electrodes EL may be performed after the formation of the first interlayer insulating layer 60. In more detail, the process of replacing the sacrificial layers SL with the electrodes EL may include a process of forming trenches which penetrate the first interlayer insulating layer 60, the planarization insulating layer 50 and the mold structure 110 to expose the substrate 10, a process of forming gate regions GR between the insulating layers ILD by removing the sacrificial layers SL exposed through the trenches, and a process of forming the electrodes EL in the gate regions GR, respectively. Here, the trenches may extend in a first direction D1 and may be spaced apart from each other in a second direction D2 intersecting the first direction D1. The trenches may be spaced apart from the first and second vertical structures VS1 and VS2 and may expose sidewalls of the sacrificial layers SL and sidewalls of the insulating layers ILD.

The process of forming the gate regions GR may include a process of isotropically etching the sacrificial layers SL using an etch recipe having an etch selectivity with respect to the planarization insulating layer 50, the insulating layers ILD, the first and second vertical structures VS1 and VS2 and the substrate 10.

In some embodiments, the gate regions GR may expose portions of sidewalls of the first and second vertical structures VS1 and VS2. However, a lowermost gate region GR may expose portions of the sidewalls of the first lower semiconductor patterns LSP1 on the cell array region CAR and may expose portions of the sidewalls of the second lower semiconductor patterns LSP2 on the connection region CNR.

Gate insulating layers 15 may be formed on the sidewalls of the first and second lower semiconductor patterns LSP1 and LSP2 exposed by the lowermost gate region GR. The gate insulating layers 15 may be formed by a thermal treatment process performed in a gas atmosphere including oxygen atoms. Thus, the sidewalls of the first and second lower semiconductor patterns LSP1 and LSP2 exposed by the lowermost gate region GR may be thermally oxidized to form the gate insulating layers 15.

Figure 13:
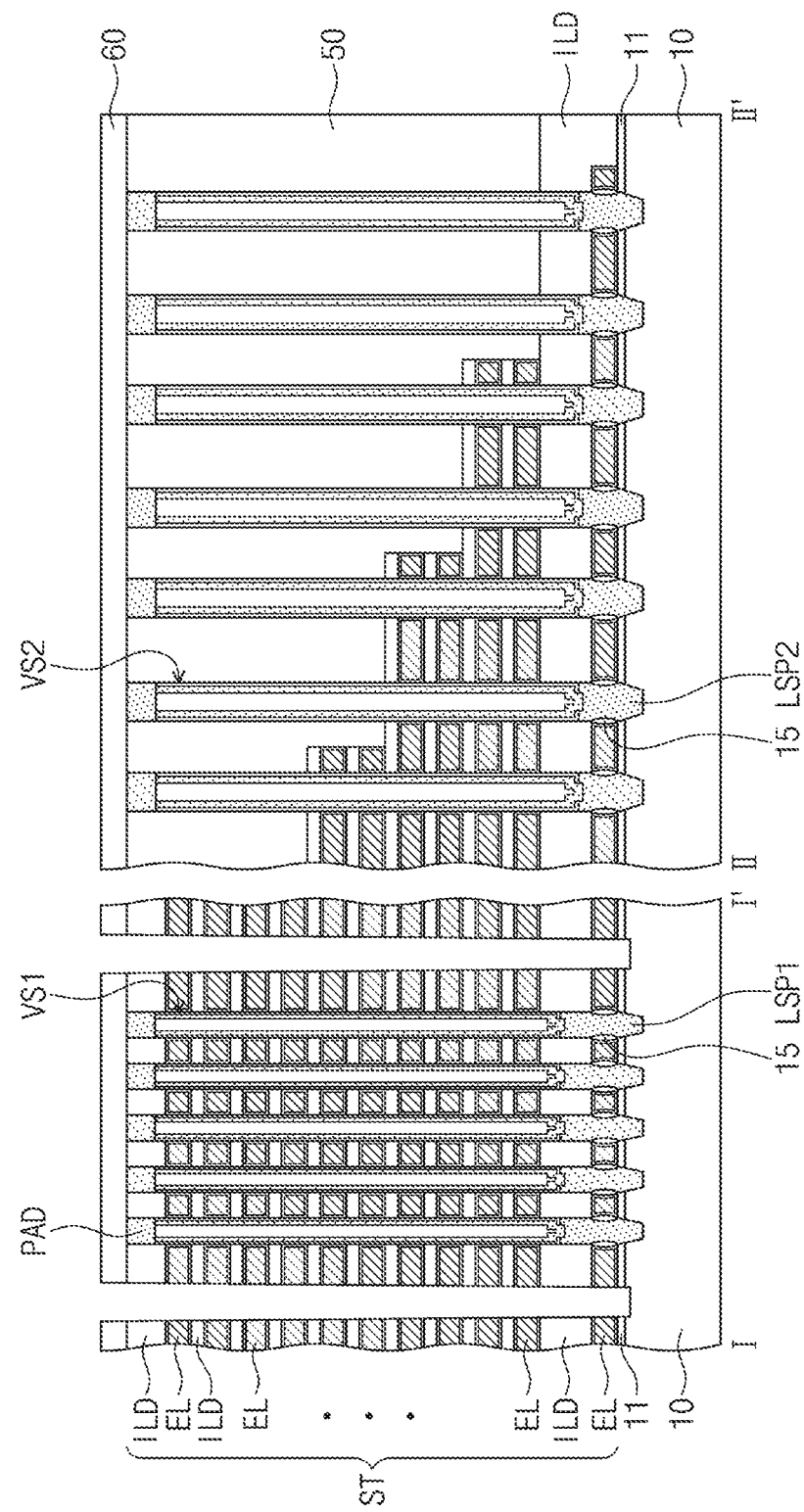

Referring to FIGS. 2A and 13, a horizontal insulating layer, a barrier metal layer and a metal layer may be sequentially deposited on the mold structure 110 having the gate regions GR, and the barrier metal layer and the metal layer outside the gate regions GR may be removed to form the electrodes EL in the gate regions GR, respectively. The horizontal insulating layer may correspond to a portion of a data storage layer and may include a silicon oxide layer and/or a high-k dielectric layer. For example, the barrier metal layer may be formed of a metal nitride layer such as a titanium nitride (TiN) layer, a tantalum nitride (TaN) layer, or a tungsten nitride (WN) layer. For example, the metal layer may be formed of a metal material such as tungsten (W), aluminum (Al), titanium (Ti), tantalum (Ta), cobalt (Co), or copper (Cu). The sacrificial layers SL of the mold structure 110 may be replaced with the electrodes EL as described above, and thus an electrode structure ST may be formed. The electrode structure ST may include the electrodes EL and the insulating layers ILD which are vertically and alternately stacked, as described with reference to FIGS. 2A, 2B and 3.

Figure 14:
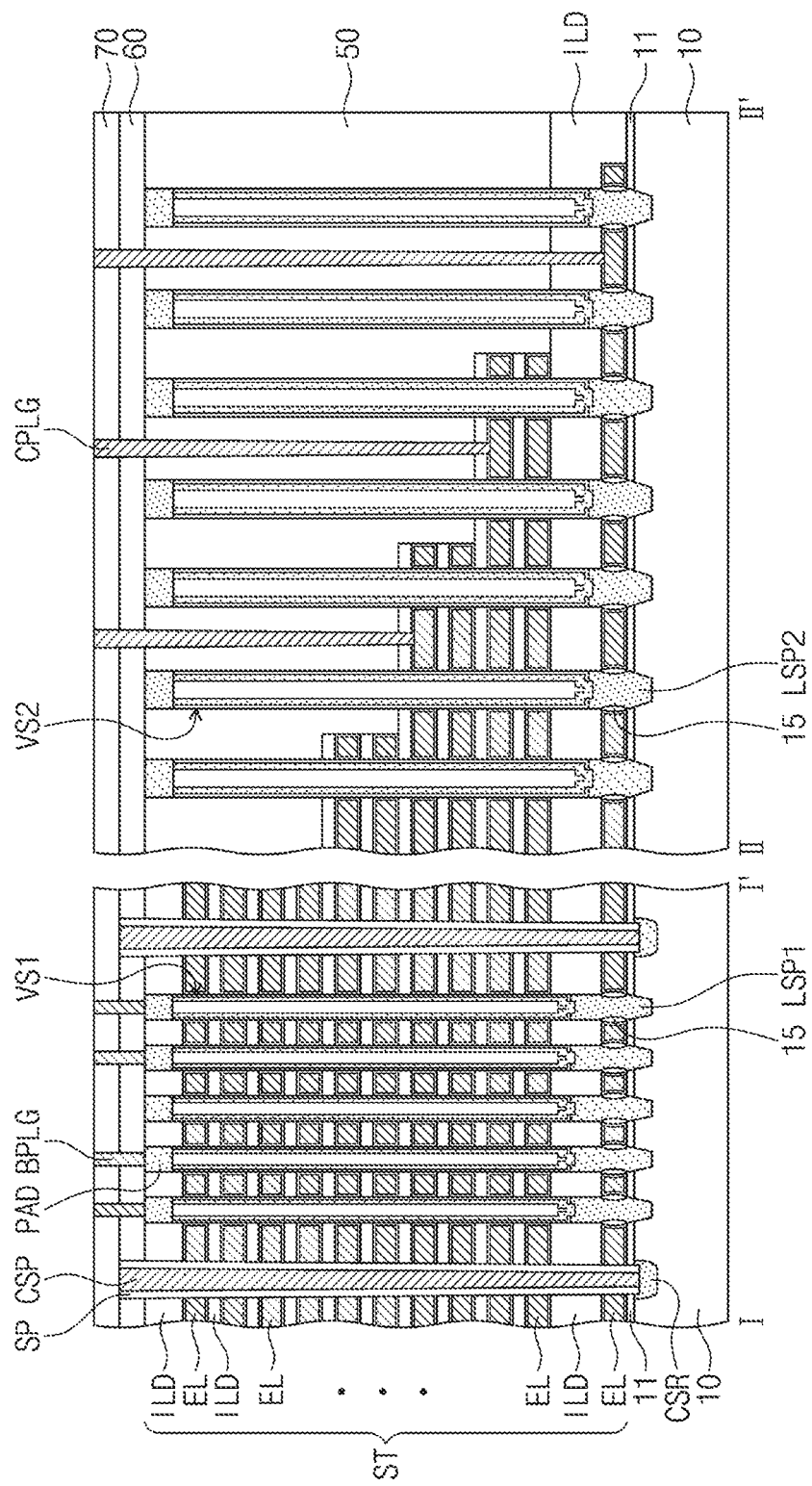

Referring to FIGS. 2A and 14, common source regions CSR may be formed in the substrate 10. The common source regions CSR may extend in parallel in the first direction D1 and may be spaced apart from each other in the second direction D2. Dopants having a conductivity type different from that of the substrate 10 may be injected into the substrate 10 to form the common source regions CSR. For example, the common source regions CSR may include N-type dopants (e.g., arsenic (As) or phosphorus (P)).

After the formation of the electrode structure ST, insulating spacers SP may be formed to extend along or cover sidewalls of the electrode structure ST. The insulating spacers SP may be formed of an insulating material such as silicon oxide, silicon nitride, silicon oxynitride, or a low-k material having a low dielectric constant.

A common source plug CSP may be formed in each of the trenches in which the insulating spacers SP are formed. The common source plug CSP may be connected to the common source region CSR. The common source plug CSP may extend in parallel to the electrodes EL, and a top surface of the common source plug CSP may be higher than the top surfaces of the first and second vertical structures VS1 and VS2.

A second interlayer insulating layer 70 may be formed on the first interlayer insulating layer 60 to extend along or cover the top surfaces of the common source plugs CSP. Subsequently, bit line contact plugs BPLG may be formed to penetrate the first and second interlayer insulating layers 60 and 70 of the cell array region CAR. The bit line contact plugs BPLG may be connected to the first vertical structures VS1, respectively. Cell contact plugs CPLG may be formed on the connection region CNR and may be connected to pad portions of the electrodes EL, respectively. Thereafter, sub-bit lines SBL, a third interlayer insulating layer 80, bit lines BL and interconnection lines CL may be formed on the second interlayer insulating layer 70, as described with reference to FIG. 3.

FIGS. 15 to 18, 20 and 21 are enlarged views of portions 'P5' and 'P6' of FIG. 11 to illustrate a method of forming first and second vertical structures in a method for fabricating a 3D semiconductor memory device according to some embodiments of the inventive concepts.

Figure 15:
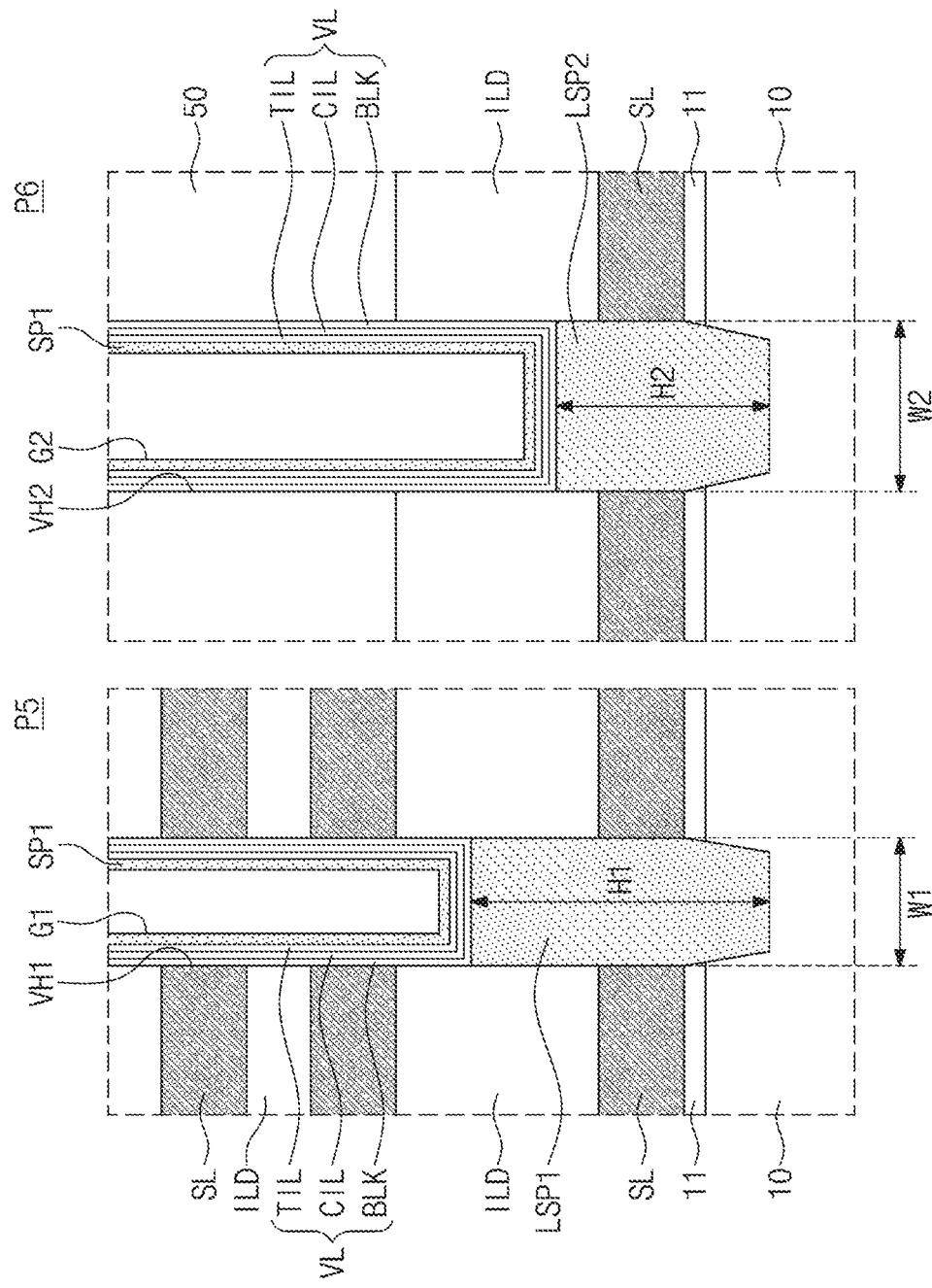
FIGS. 15 to 18, 20 and 21 are enlarged views of portions 'P5' and 'P6' of FIG. 11 to illustrate a method of forming first and second vertical structures in a method for fabricating a 3D semiconductor memory device according to some embodiments of the inventive concepts.

Referring to FIG. 15, the first and second lower semiconductor patterns LSP1 and LSP2 may be formed in the lower regions of the first and second vertical holes VH1 and VH2, respectively. As described above with reference to FIG. 10, the height H1 of the first lower semiconductor pattern LSP1 may be greater than the height H2 of the second lower semiconductor pattern LSP2, and the width W1 of the first lower semiconductor pattern LSP1 may be less than the width W2 of the second lower semiconductor pattern LSP2.

A vertical insulating layer VL and a first semiconductor layer SP1 may be sequentially formed in the first and second vertical holes VH1 and VH2 having the first and second lower semiconductor patterns LSP1 and LSP2. The vertical insulating layer VL and the first semiconductor layer SP1 may be formed to have substantially uniform thicknesses on inner sidewalls of the first and second vertical holes VH1 and VH2 and top surfaces of first and second lower semiconductor patterns LSP1 and LSP2. A sum of the thicknesses of the vertical insulating layer VL and the first semiconductor layer SP1 may be less than about a half of an upper width of the first vertical hole VH1. In other words, the first and second vertical holes VH1 and VH2 may not be completely filled with the vertical insulating layer VL and the first semiconductor layer SP1, and gap regions G1 and G2 may be respectively defined in the first and second vertical holes VH1 and VH2 by the vertical insulating layer VL and the first semiconductor layer SP1.

The vertical insulating layer VL may include a single layer or a plurality of layers. In some embodiments, the vertical insulating layer VL may include a tunnel insulating layer TIL, a charge storage layer CIL and a blocking insulating layer BLK, which are used as a data storage layer of a vertical NAND flash memory device. The first semiconductor layer SP1 may include silicon (Si), germanium (Ge), or a combination thereof. For example, the first semiconductor layer SP1 may be a poly-crystalline silicon layer.

Figure 16:
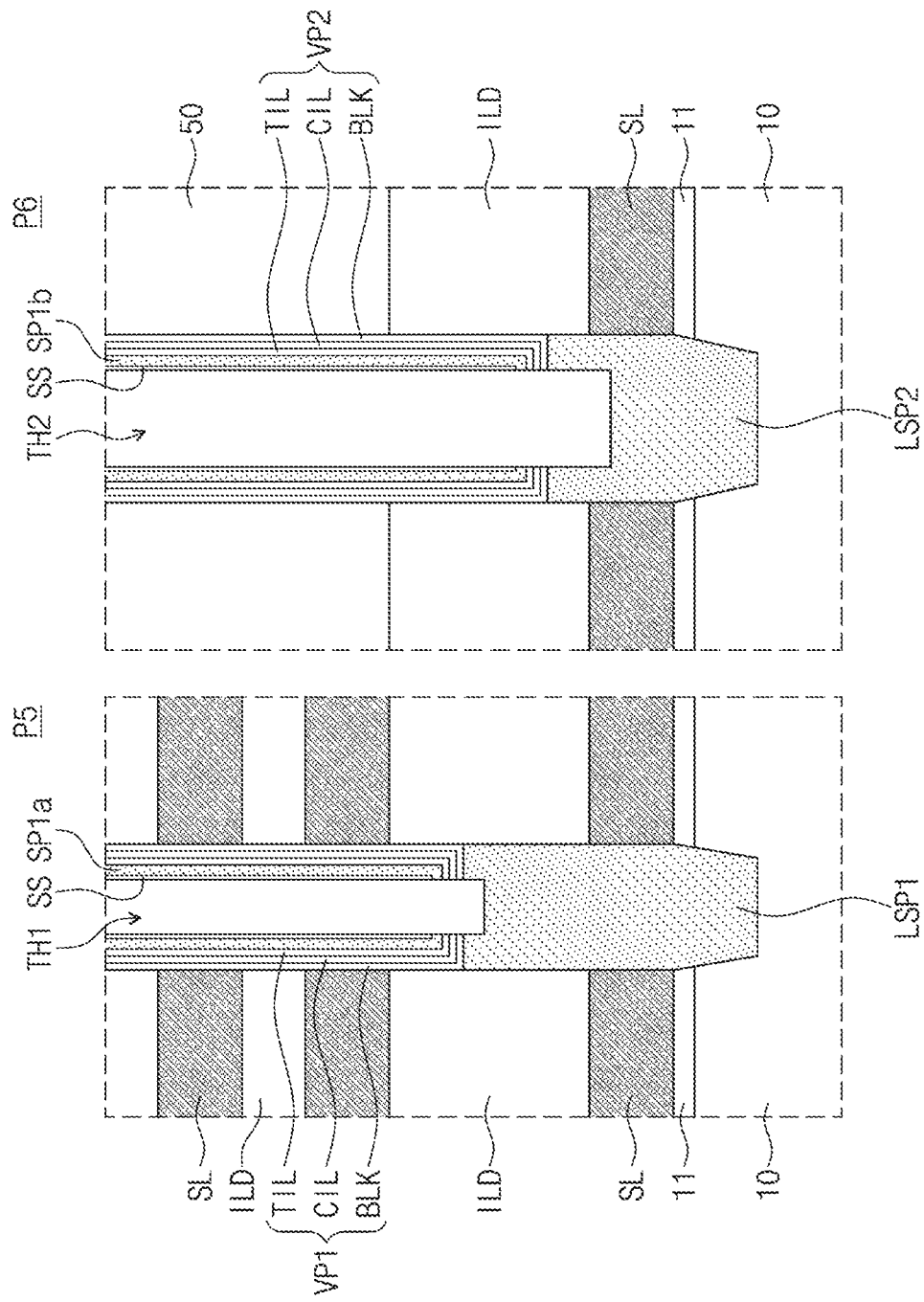

Referring to FIG. 16, the vertical insulating layer VL and the first semiconductor layer SP may be anisotropically etched to form first and second through-holes TH1 and TH2 exposing the first and second lower semiconductor patterns LSP1 and LSP2. The first semiconductor layer SP1 and the vertical insulating layer VL may be etched using buffer spacers SS, covering inner sidewalls of the first semiconductor layer SP1, as etch masks by a plasma dry etching process, and thus the first and second through-holes TH1 and TH2 may be formed. Due to the formation of the first and second through-holes TH1 and TH2, the first vertical insulating pattern VP1 and a first semiconductor pattern SP1$a$ may be formed in the first vertical hole, and the second vertical insulating pattern VP2 and a first dummy semiconductor pattern SP1$b$ may be formed in the second vertical hole.

Portions of the vertical insulating layer, which are disposed under the first semiconductor pattern SP1$a$ and the first dummy semiconductor pattern SP1$b$, may not be etched during the anisotropic etching process, and thus the first vertical insulating pattern VP1 may have a protrusion disposed between a bottom surface of the first semiconductor pattern SP1$a$ and the top surface of the first lower semiconductor pattern LSP1 and the second vertical insulating pattern VP2 may have a protrusion disposed between a bottom surface of the first dummy semiconductor pattern SP1$b$ and the top surface of the second lower semiconductor pattern LSP2.

The first and second lower semiconductor patterns LSP1 and LSP2 may be exposed by the anisotropic etching process. The exposed top surfaces of the first and second lower semiconductor patterns LSP1 and LSP2 may be recessed by over-etching in the anisotropic etching process. At this time, since the first and second gap regions G1 and G2 have different widths and different vertical lengths, recessed depths of the top surfaces of the first and second lower semiconductor patterns LSP1 and LSP2 may be different from each other.

Figure 17:
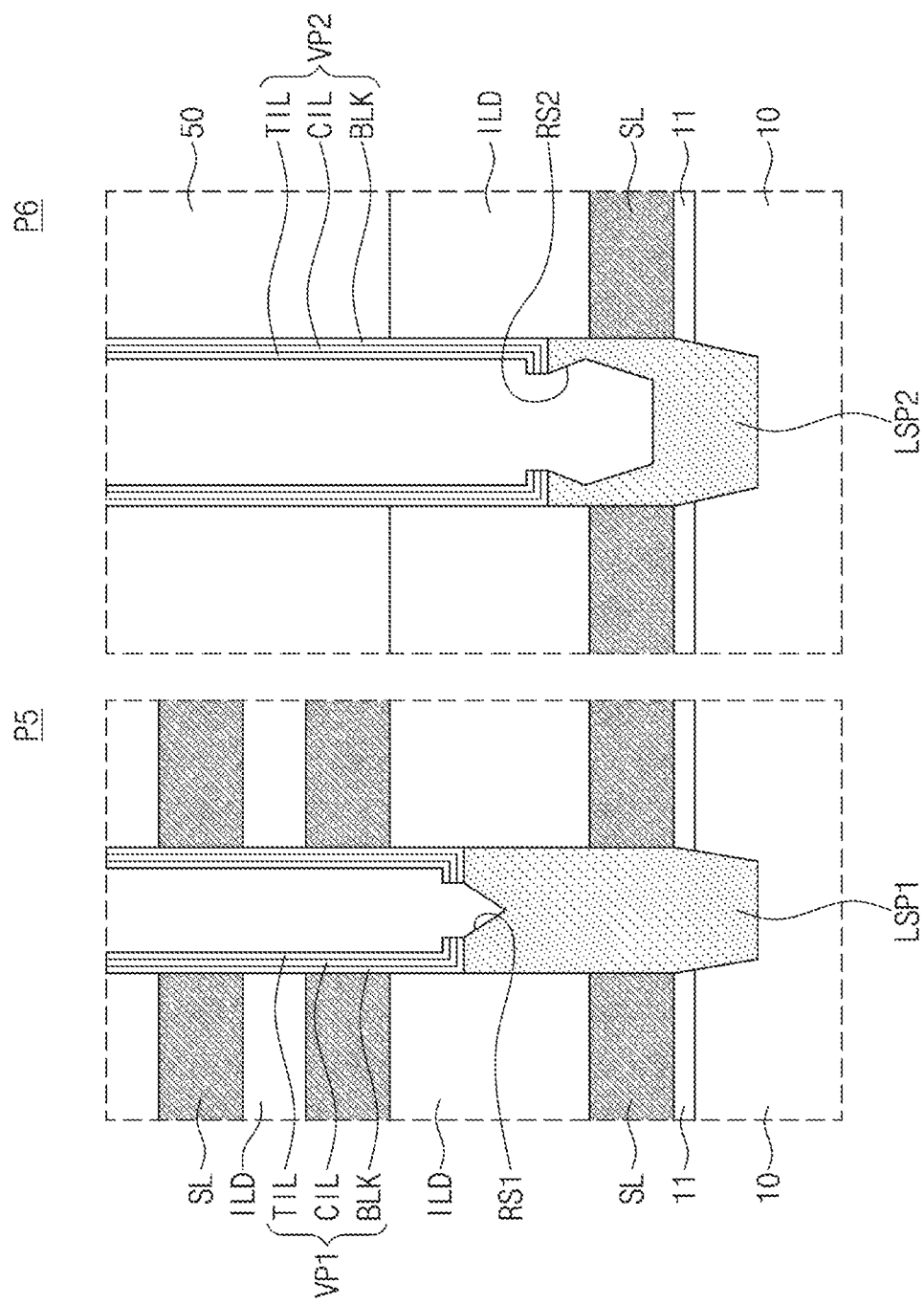

Next, the first semiconductor pattern SP1$a$ and the first dummy semiconductor pattern SP1$b$ exposed in the first and second through-holes TH1 and TH2 may be removed. Thus, inner sidewalls of the first and second vertical insulating patterns VP1 and VP2 may be exposed as illustrated in FIG. 17.

The first semiconductor pattern SP1$a$ and the first dummy semiconductor pattern SP1$b$ may be removed by a dry or wet etching process and may be removed using an etch recipe having an etch selectivity with respect to the first and second vertical insulating patterns VP1 and VP2.

The etching process of removing the first semiconductor pattern SP1$a$ and the first dummy semiconductor pattern SP1$b$ may be performed using a chemical physical etching method (e.g., a reactive ion etching (RIE) method), an isotropic etching method (e.g., a wet etching method using an etchant), a chemical pyrolysis etching method (e.g., a gas-phase etching (GPE) method), or any combination thereof. For example, the isotropic etching or gas-phase etching (GPE) process may be performed on the first semiconductor pattern SP1a and the first dummy semiconductor pattern SP1b. In the isotropic etching process, a standard clean 1 (SC1) solution or a gas-phase etchant including chlorine (e.g., $Cl_2$) may be used.

The top surfaces of the first and second lower semiconductor patterns LSP1 and LSP2 may be etched in the etching process of removing the first semiconductor pattern SP1a and the first dummy semiconductor pattern SP1b. For example, an etching process using an ammonia ($NH_4OH$) solution may be performed. In this case, first and second recess regions RS1 and RS2 having sidewalls inclined with respect to the top surface of the substrate 10 may be formed in the first and second lower semiconductor patterns LSP1 and LSP2. In more detail, in the etching process using the ammonia solution, an etch rate may be changed depending on a crystal plane and a crystal orientation of silicon. The first recess region RS1 of the first lower semiconductor pattern LSP1 may have a tapered wedge shape defined by two inclined sidewalls. The second recess region RS2 of the second lower semiconductor pattern LSP2 may be horizontally and vertically etched to have a substantially hexagonal shape. In this case, a thickness of the second lower semiconductor pattern LSP2 on the sidewall of the lowermost sacrificial layer SL may be reduced.

Figure 18:
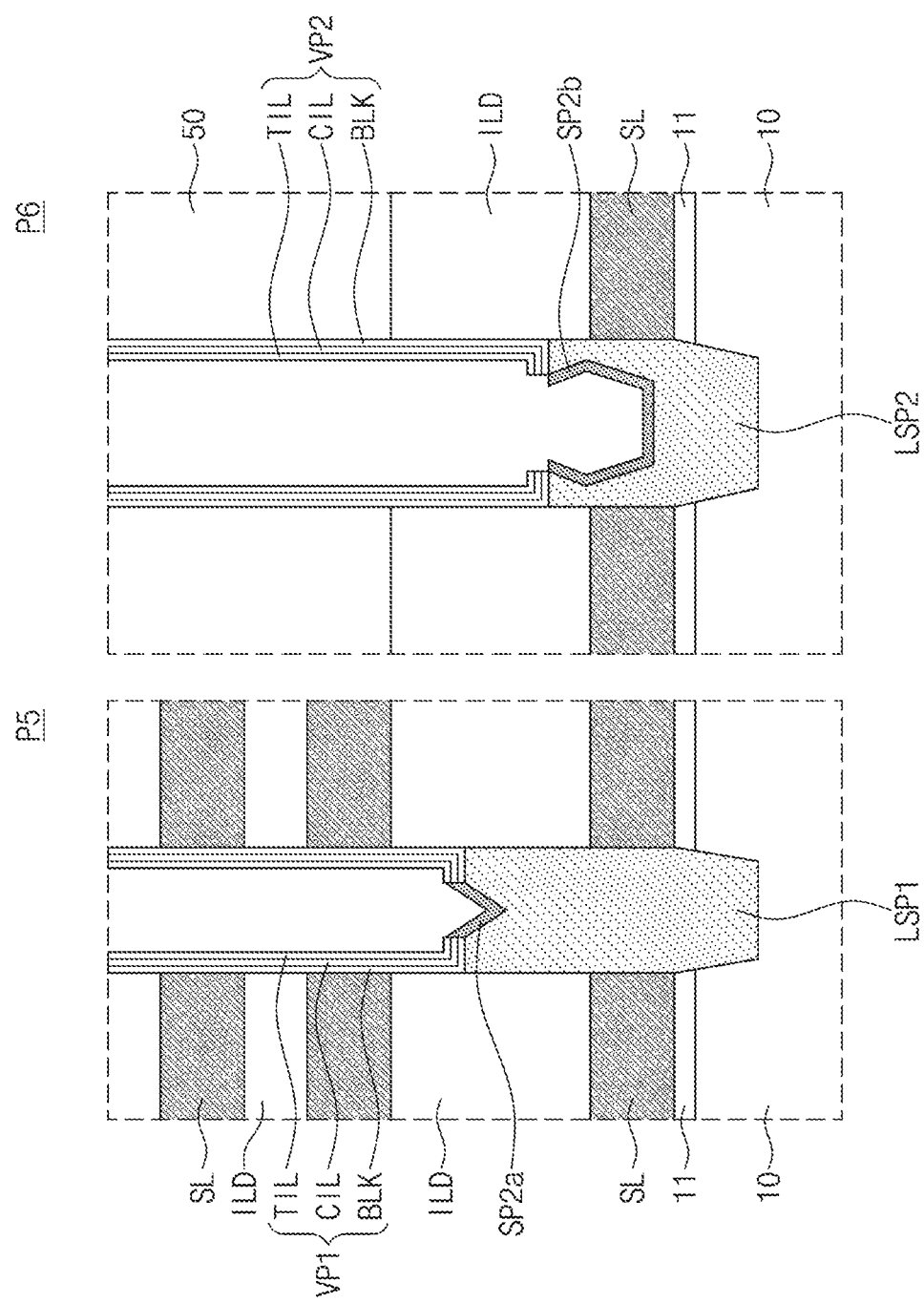

Referring to FIG. 18, first and second local semiconductor layers SP2a and SP2b may be selectively formed in the first and second recess regions RS1 and RS2 of the first and second lower semiconductor patterns LSP1 and LSP2, respectively. The first and second local semiconductor layers SP2a and SP2b may be formed by performing a selective deposition process. Here, the selective deposition process may include a deposition process of which a deposition rate is changed depending on a material of an underlying layer, and an etching process. In the selective deposition process, the deposition process and the etching process may be alternately repeated. The selective deposition process will be described in more detail with reference to FIGS. 19A, 19B and 19C.

Figure 19A:
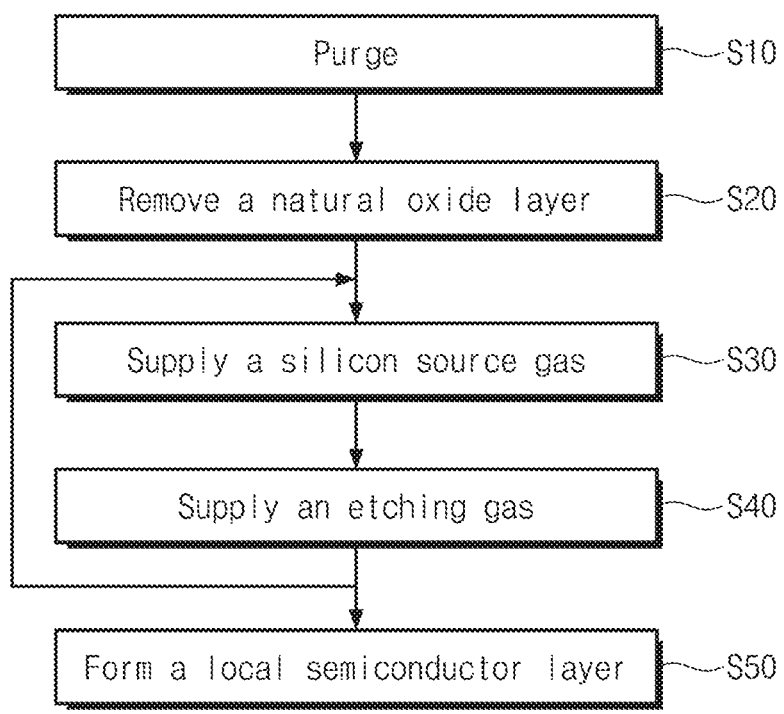
FIG. 19A is a flowchart illustrating a method of forming a local semiconductor layer in a method of forming a channel semiconductor pattern according to some embodiments of the inventive concepts.

Referring to FIG. 19A, the selective deposition process may include purging a process chamber (S10), removing a natural oxide layer (S20), supplying a silicon source gas (S30), and supplying an etching gas (or a selective etching gas) (S40). Here, the supplying of the silicon source gas (S30) and the supplying of the etching gas (S40) may be alternately repeated. The silicon source gas may include $SiH_4$, $Si_2H_6$, $Si_3H_8$, $SiH_3Cl$, $SiH_2Cl_6$, $SiCl_4$, dichlorosilane (DCS), trichlorosilane (TCS), and/or hexachlorosilane (HCS). In addition, the silicon source gas may be supplied together with a carrier gas. For example, the carrier gas may include a hydrogen gas, a helium gas, a nitrogen gas, and/or an argon gas. The etching gas may include a halogen element reacting with silicon atoms. For example, the etching gas may include $F_2$, $Cl_2$, HBr, HCl, or any combination thereof. The selective deposition process may be performed at a temperature of about 300 degrees Celsius to about 600 degrees Celsius.

Figure 19B:
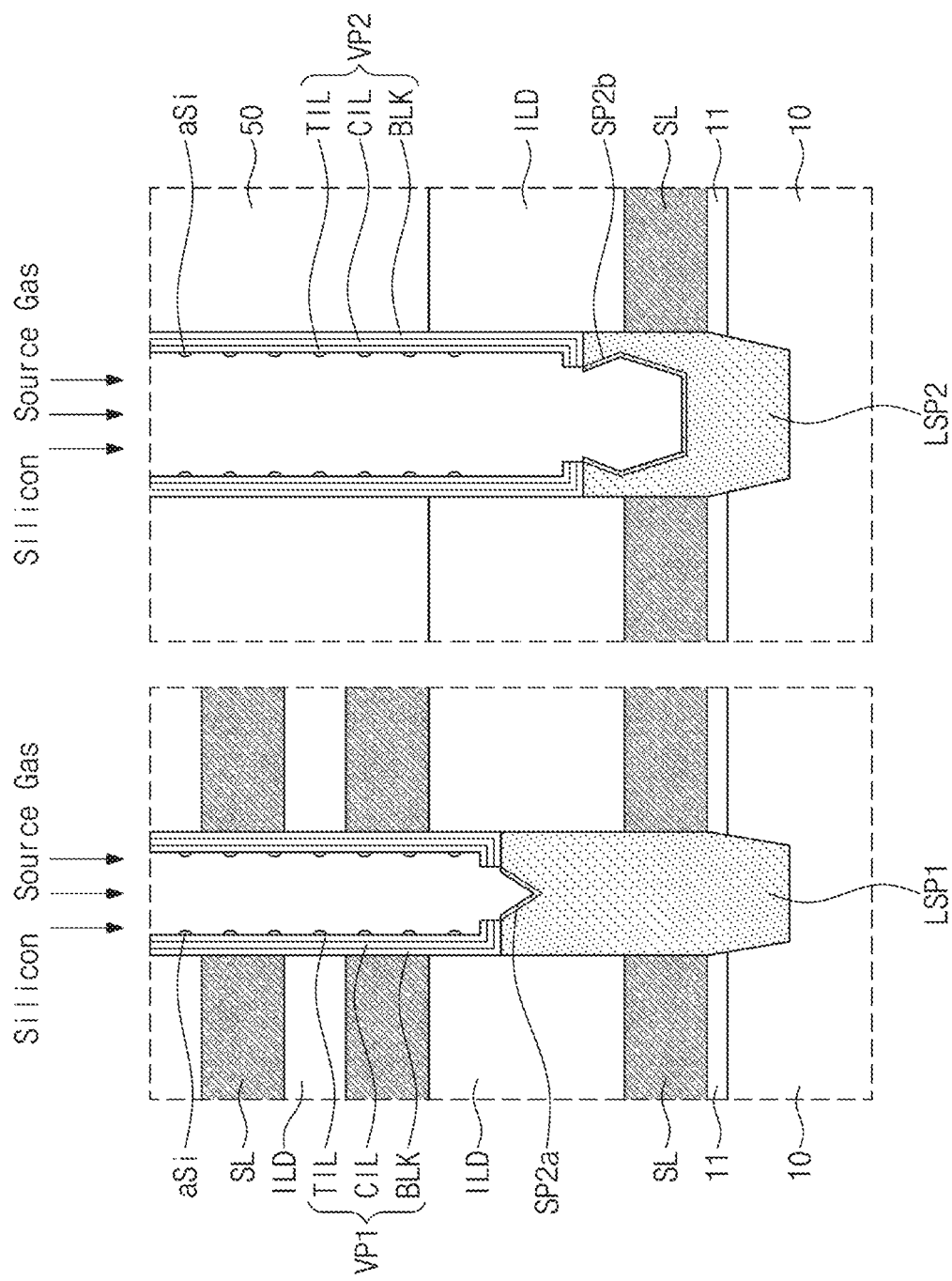
FIGS. 19B and 19C are enlarged views illustrating a method of forming a local semiconductor layer in a method for fabricating a 3D semiconductor memory device according to some embodiments of the inventive concepts.

Referring to FIG. 19B, the silicon source gas provided into the first and second through-holes may be deposited thicker on the first and second lower semiconductor patterns LSP1 and LSP2 than on the first and second vertical insulating patterns VP1 and VP2 formed of an insulating material. A deposition rate of the silicon source gas on the first and second lower semiconductor patterns LSP1 and LSP2 may be greater than a deposition rate of the silicon source gas on the first and second vertical insulating patterns VP1 and VP2 formed of the insulating material. In addition, a crystal structure of silicon layers deposited on surfaces of the first and second vertical insulating patterns VP1 and VP2 may be different from that of silicon layers deposited on surfaces of the first and second lower semiconductor patterns LSP1 and LSP2. In other words, the silicon layers aSi deposited on the surfaces of the first and second vertical insulating patterns VP1 and VP2 may be amorphous silicon layers, and the silicon layers SP2a and SP2b deposited on the surfaces of the first and second lower semiconductor patterns LSP1 and LSP2 may be crystalline silicon layers.

Figure 19C:
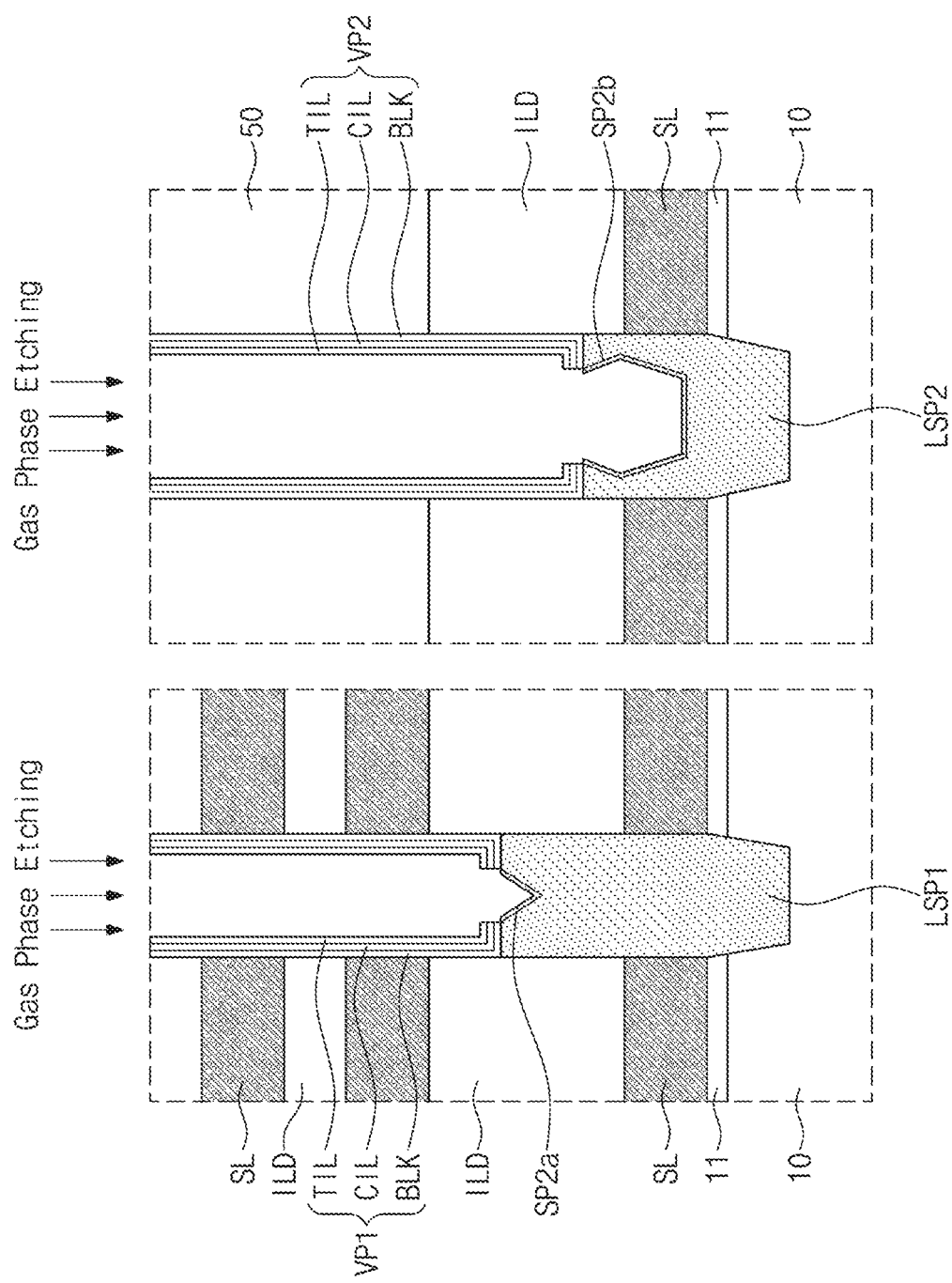

Referring to FIG. 19C, after the silicon layers are deposited, the etching gas including the halogen element may be supplied to perform an etching process on the silicon layers aSi deposited on the surfaces of the first and second vertical insulating patterns VP1 and VP2. Since the crystal structure of the silicon layers aSi on the first and second vertical insulating patterns VP1 and VP2 is different from that of the silicon layers SP2a and SP2b on the first and second lower semiconductor patterns LSP1 and LSP2, the silicon layers aSi on the first and second vertical insulating patterns VP1 and VP2 may be selectively etched.

Thereafter, the supplying of the silicon source gas (S30) and the supplying of the etching gas (S40) may be alternately repeated, and thus silicon layers having a predetermined thickness may remain on the first and second lower semiconductor patterns LSP1 and LSP2 but the silicon layers aSi on the first and second vertical insulating patterns VP1 and VP2 may be removed. As a result, the first and second local semiconductor layers SP2a and SP2b may be selectively deposited on the first and second lower semiconductor patterns LSP1 and LSP2, respectively (S50). The second local semiconductor layer SP2b may compensate the thickness of the second lower semiconductor pattern LSP2, which is reduced on the sidewall of the lowermost sacrificial layer SL during the removal of the first dummy semiconductor pattern SP1b. Thus, when the second lower semiconductor pattern LSP2 is thermally oxidized to form the gate insulating layer 15 as described above with reference to FIG. 12, the second local semiconductor layer SP2b may be used as an additional silicon source.

Figure 20:
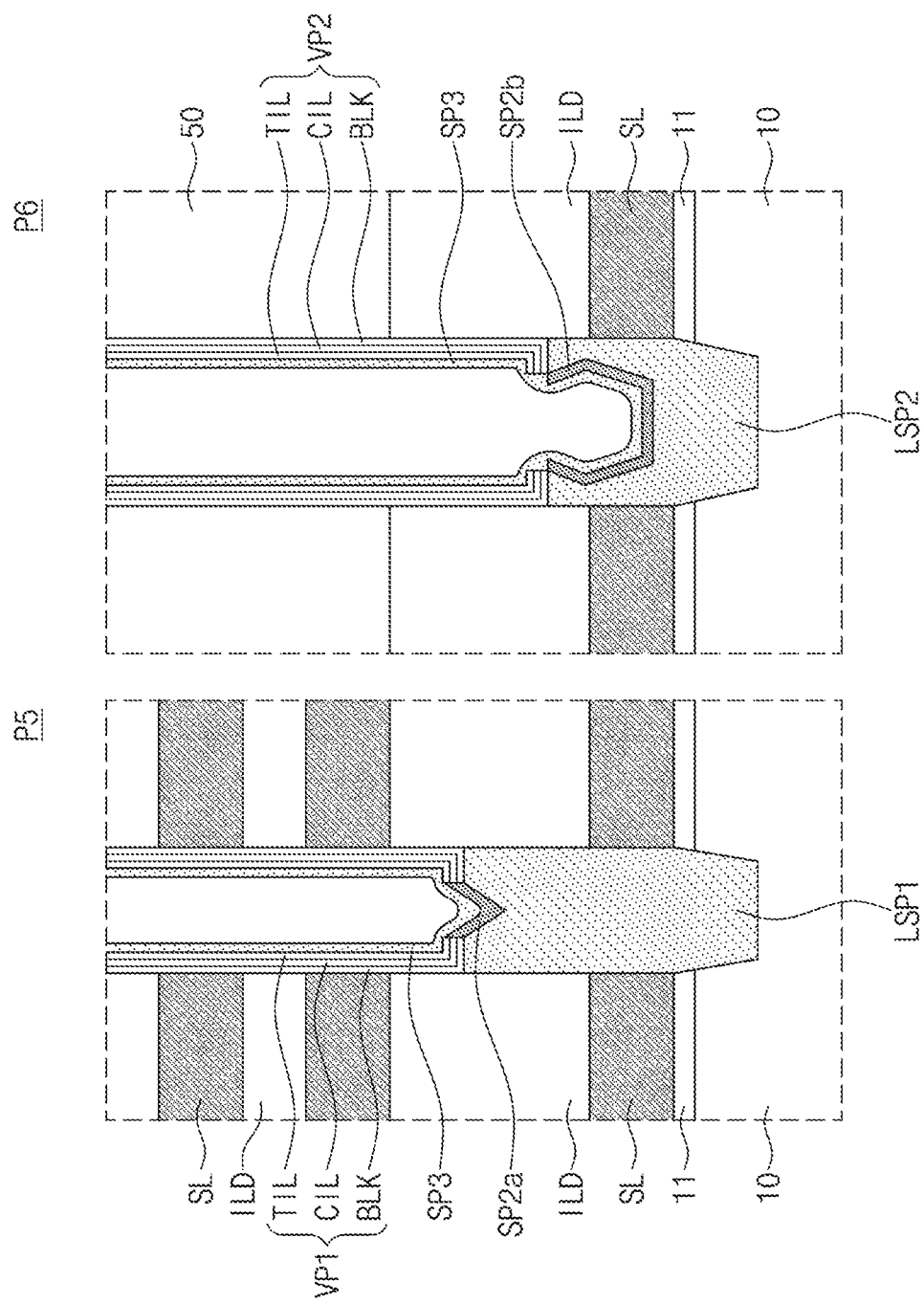

Referring to FIG. 20, a second semiconductor layer SP3 may be formed to conformally cover the inner sidewalls of the first and second vertical insulating patterns VP1 and VP2 and surfaces of the first and second local semiconductor layers SP2a and SP2b. The second semiconductor layer SP3 may not completely fill the first and second through-holes. The second semiconductor layer SP3 may be, for example, a poly-crystalline silicon layer, a single-crystalline silicon layer, or an amorphous silicon layer.

Next, a thermal treatment process may be performed on the second semiconductor layer SP3. The second semiconductor layer SP3 may be recrystallized by the thermal treatment process. Thus, grain boundaries in the second semiconductor layer SP3 may be reduced. The thermal treatment process may include a hydrogen annealing process which is performed in a gas atmosphere including hydrogen or heavy hydrogen.

Figure 21:
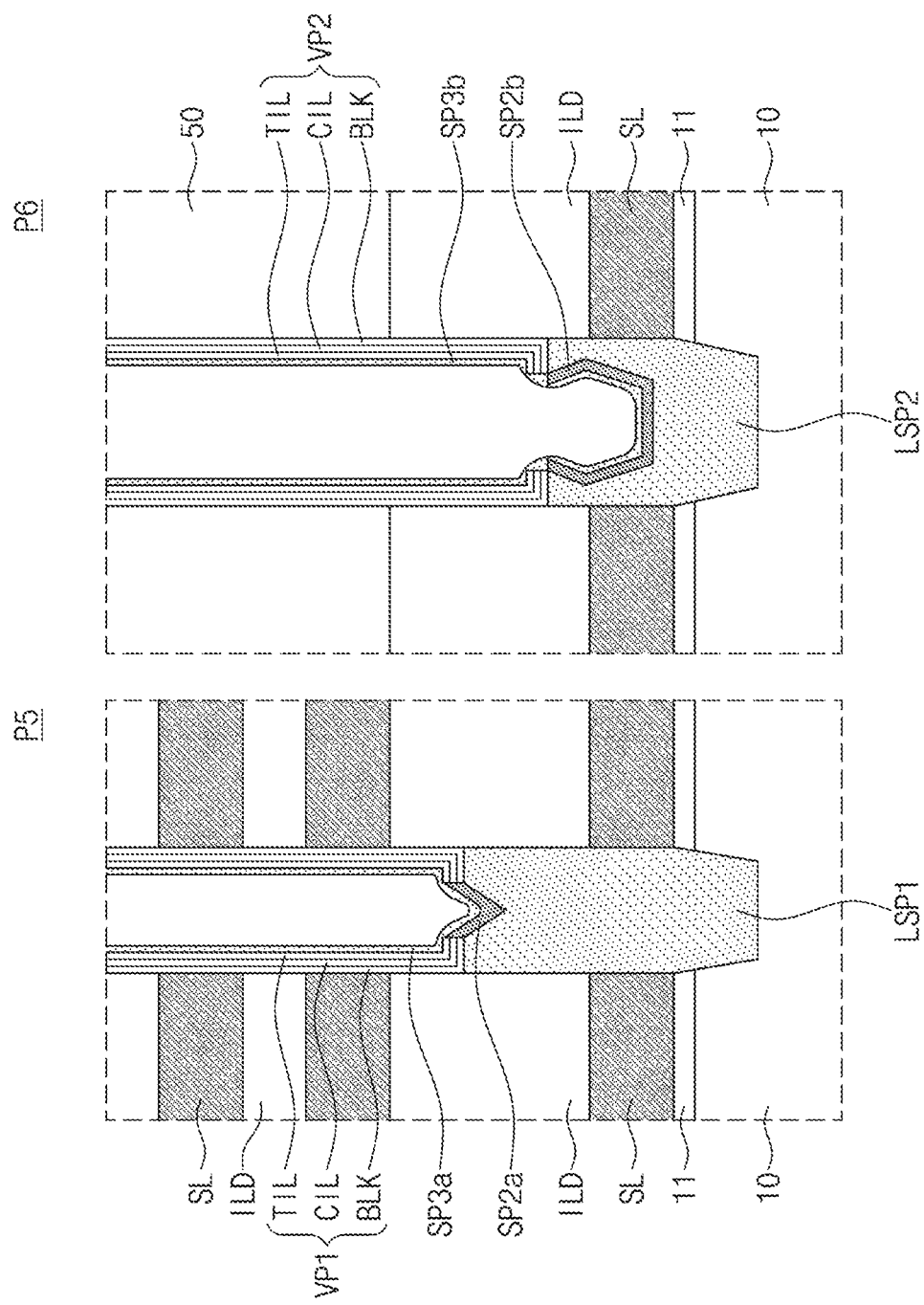

Subsequently, referring to FIG. 21, an isotropic etching process may be performed to reduce a thickness of the second semiconductor layer SP3. In the isotropic etching process, an etching solution may include $NH_4OH$, SC1, and/or HCL. Surfaces of the second semiconductor layers SP3a and SP3b etched by the isotropic etching process may be rounded. Even though the thickness of the second semiconductor layer is reduced, the second semiconductor layers SP3a and SP3b having the reduced thicknesses may be connected to the first and second local semiconductor layers SP2a and SP2b. In other words, the second semiconductor layers SP3a and SP3b having the reduced thicknesses may be connected to the first and second lower semiconductor patterns LSP1 and LSP2 through the first and second local semiconductor layers SP2a and SP2b. That is, it is possible to prevent the second semiconductor layers SP3a and SP3b having the reduced thicknesses from being disconnected from (or otherwise avoid discontinuities with) the first and second lower semiconductor patterns LSP1 and LSP2 at lower portions of the first and second vertical insulating patterns VP1 and VP2. In FIG. 21, interfaces exist between the local semiconductor layers SP2a and SP2b and the second semiconductor layers SP3a and SP3b. However, alternatively, the interfaces may not exist between the local semiconductor layers SP2a and SP2b and the second semiconductor layers SP3a and SP3b. The first and second local semiconductor layers SP2a and SP2b and the second semiconductor layers SP3a and SP3b may constitute or define the first and second vertical semiconductor patterns USP1 and USP2 described above. Thereafter, the first and second filling insulation patterns VI1 and VI2 may be formed to fill the first and second through-holes having the second semiconductor layers SP3a and SP3b.

Figure 22:
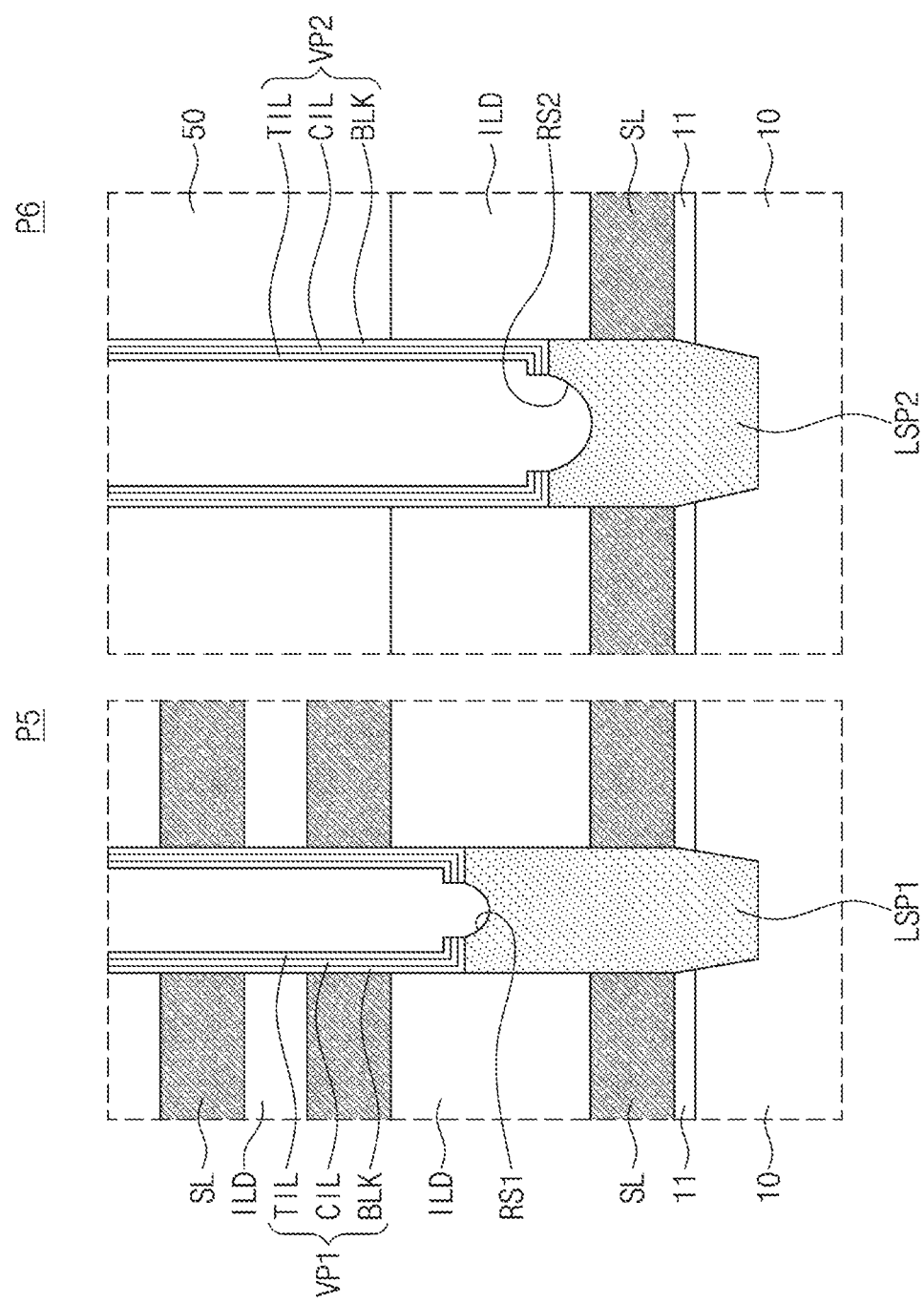
FIGS. 22, 23 and 24 are enlarged views of the portions 'P5' and 'P6' of FIG. 11 to illustrate a method of forming first and second vertical structures in a method for fabricating a 3D semiconductor memory device according to some embodiments of the inventive concepts.
Figure 23:
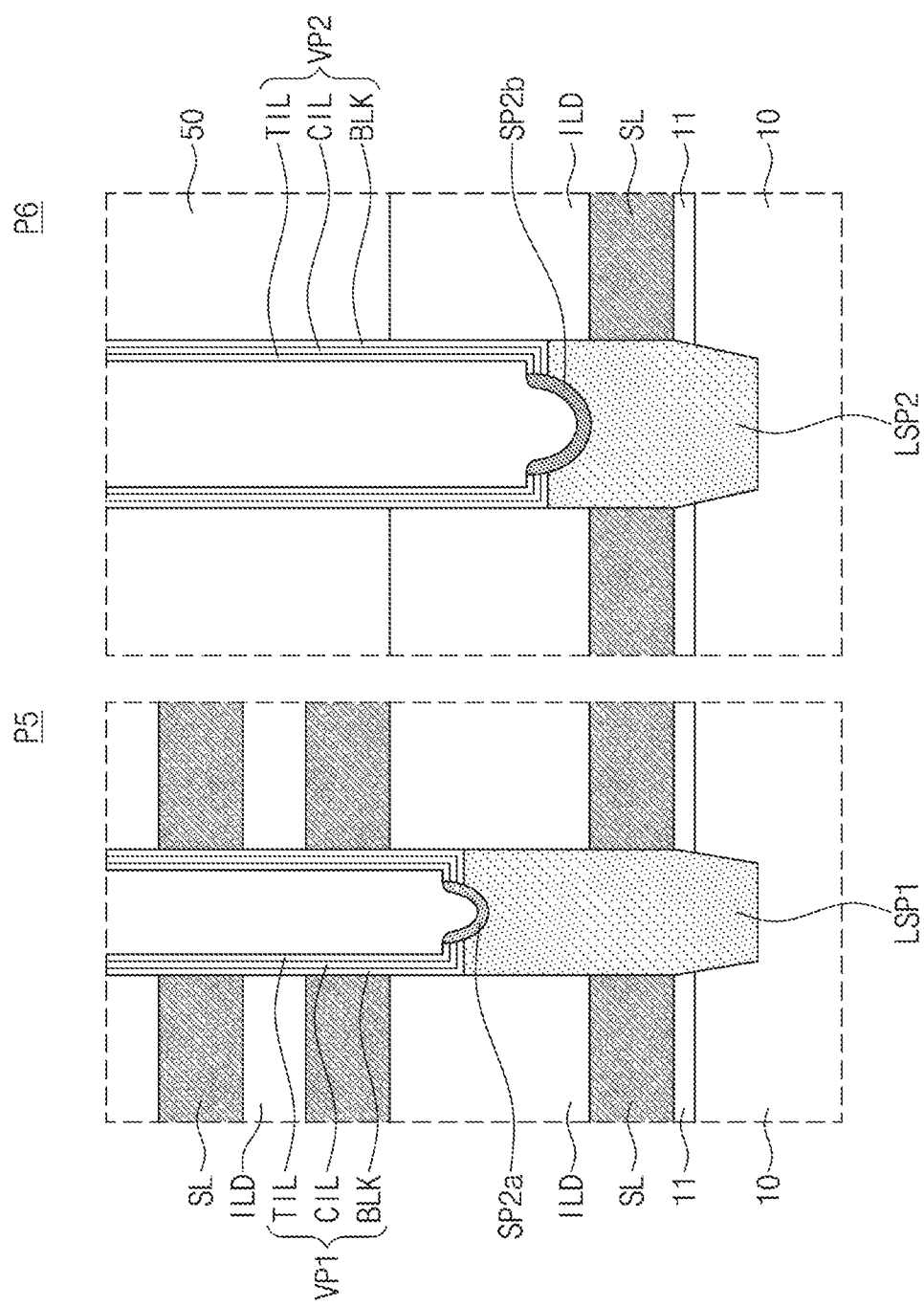
Figure 24:
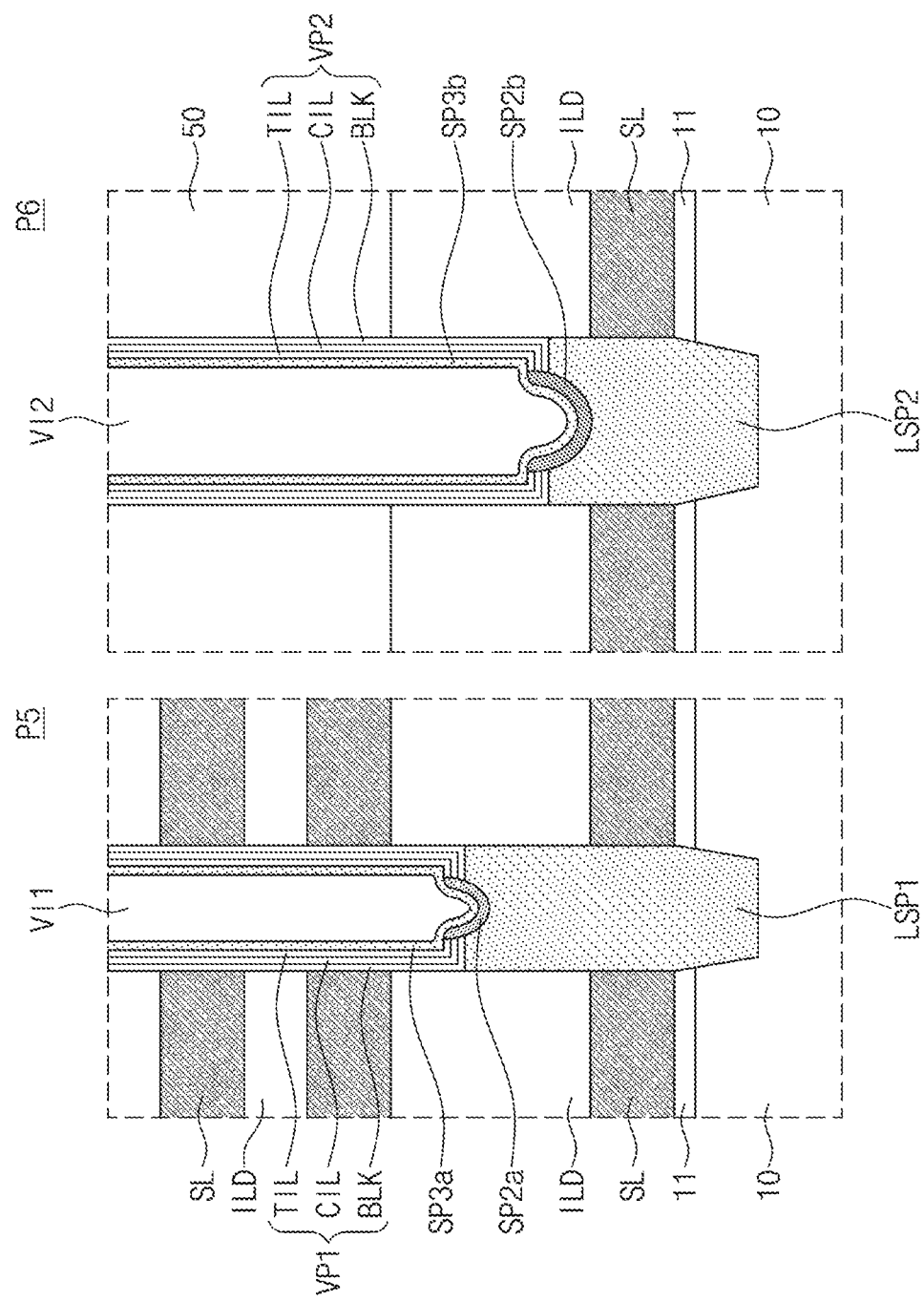

FIGS. 22, 23 and 24 are enlarged views of the portions 'P5' and 'P6' of FIG. 11 to illustrate a method of forming first and second vertical structures in a method for fabricating a 3D semiconductor memory device according to some embodiments of the inventive concepts.

Referring to FIG. 22, the gas-phase etching (GPE) process may be performed as the process of removing the first semiconductor pattern SP1a and the first dummy semiconductor pattern SP1b, as described with reference to FIG. 17. In this case, recess regions RS1 and RS2 having rounded inner surfaces may be formed in the first and second lower semiconductor patterns LSP1 and LSP2.

Referring to FIG. 23, the first and second local semiconductor layers SP2a and SP2b may be formed on the rounded inner surfaces of the recess regions RS1 and RS2, as described with reference to FIGS. 19A, 19B and 19C. Due to the selective deposition process, the first and second local semiconductor layers SP2a and SP2b may be deposited to have substantially the same profiles as the inner surfaces of the recess regions RS1 and RS2.

Referring to FIG. 24, subsequently, the second semiconductor layer may be deposited, the thermal treatment process may be performed on the second semiconductor layer, and then, the isotropic etching process may be performed on the second semiconductor layer, as described with reference to FIGS. 20 and 21.

According to some embodiments of the inventive concepts, the contact portion of the vertical semiconductor pattern, which is connected to the lower semiconductor pattern, may be thicker than the vertical channel portion of the vertical semiconductor pattern, which is disposed on the inner sidewall of the electrode structure. Thus, the greater relative thickness of the contact portion may aid in preventing the vertical semiconductor pattern from being broken or otherwise avoiding discontinuities in the vertical semiconductor pattern at a region on or adjacent to the protrusion of the vertical insulating pattern.

In addition, the vertical channel portion of the vertical semiconductor pattern may be thinner than the sidewall portion of the vertical insulating pattern, and thus grain boundaries in the vertical semiconductor pattern may be reduced. As a result, the current flowing through the vertical semiconductor pattern may be improved.

Furthermore, to form the vertical semiconductor pattern, the local semiconductor layer may be selectively deposited on the top surface of the lower semiconductor pattern, and then, a vertical semiconductor layer may be deposited on the inner surface of the vertical hole. Thus, it is possible to prevent the vertical semiconductor layer from being broken or otherwise avoid discontinuities in the vertical semiconductor pattern at a region on or adjacent to the protrusion of the vertical insulating pattern in the isotropic etching process for adjusting the thickness of the vertical semiconductor layer.

While the inventive concepts have been described with reference to example embodiments, it will be apparent to those skilled in the art that various changes and modifications may be made without departing from the spirits and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
   an electrode structure comprising electrodes vertically stacked on a semiconductor layer;
   a vertical semiconductor pattern penetrating the electrode structure and connected to the semiconductor layer; and
   a vertical insulating pattern disposed between the electrode structure and the vertical semiconductor pattern,
   wherein the vertical insulating pattern comprises:
   a sidewall portion on a sidewall of the electrode structure; and
   a protrusion extending from the sidewall portion on a portion of a top surface of the semiconductor layer,
   wherein the vertical semiconductor pattern comprises:
   a vertical channel portion having a first thickness in a horizontal direction and extending along the sidewall portion of the vertical insulating pattern; and
   a contact portion extending from the vertical channel portion and conformally along the protrusion of the vertical insulating pattern and the top surface of the semiconductor layer, wherein the contact portion has a second thickness in the horizontal direction on a sidewall of the protrusion, and wherein the second thickness is greater than the first thickness.

2. The 3D semiconductor memory device of claim 1, wherein the sidewall portion of the vertical insulating pattern has a third thickness that is greater than the first thickness.

3. The 3D semiconductor memory device of claim 1, wherein the vertical channel portion of the vertical semiconductor pattern is disposed on a top surface of the protrusion of the vertical insulating pattern.

4. The 3D semiconductor memory device of claim 1, further comprising:
   a filling insulation pattern filling a gap region defined by the vertical channel portion and the contact portion of the vertical semiconductor pattern,
   wherein the filling insulation pattern comprises a lower portion adjacent to the contact portion, and an upper portion adjacent to the vertical channel portion, wherein a width of the lower portion is less than a width of the upper portion.

5. The 3D semiconductor memory device of claim 1, further comprising:
a filling insulation pattern filling a gap region defined by the vertical channel portion and the contact portion of the vertical semiconductor pattern,
wherein a bottom surface of the filling insulation pattern is disposed at a lower level than a bottom surface of the vertical insulating pattern relative to the semiconductor layer.

6. The 3D semiconductor memory device of claim 1, wherein a bottom surface of the vertical semiconductor pattern is disposed at a lower level than the top surface of the semiconductor layer.

7. The 3D semiconductor memory device of claim 1, wherein the semiconductor layer comprises a recess region that is disposed under the vertical semiconductor pattern and has a sidewall that is inclined with respect to the top surface of the semiconductor layer, and
wherein the contact portion of the vertical semiconductor pattern is in contact with the sidewall that is inclined.

8. The 3D semiconductor memory device of claim 1, wherein the semiconductor layer comprises a recess region having a rounded inner surface under the vertical semiconductor pattern, and
wherein the contact portion of the vertical semiconductor pattern is in contact with the rounded inner surface.

9. The 3D semiconductor memory device of claim 1, further comprising:
a dummy vertical semiconductor pattern that is spaced apart from the vertical semiconductor pattern and penetrates the electrode structure so as to be connected to the semiconductor layer; and
a dummy vertical insulating pattern disposed between the dummy vertical semiconductor pattern and the electrode structure,
wherein a width of the dummy vertical semiconductor pattern is greater than a width of the vertical semiconductor pattern.

10. The 3D semiconductor memory device of claim 9, wherein a bottom surface of the dummy vertical semiconductor pattern is disposed at a lower level than a bottom surface of the vertical semiconductor pattern relative to the semiconductor layer.

11. The 3D semiconductor memory device of claim 9, wherein the dummy vertical semiconductor pattern comprises a first portion on an inner sidewall of the dummy vertical insulating pattern; and a second portion conformally extending along the top surface of the semiconductor layer, wherein the second portion is thicker than the first portion.

12. The 3D semiconductor memory device of claim 1, wherein the semiconductor layer includes a first region and a second region adjacent to the first region, and
wherein the electrode structure extends from the first region onto the second region and has a stepped structure on the second region.

13. A three-dimensional (3D) semiconductor memory device comprising:
a substrate including a first region and a second region;
an electrode structure comprising electrodes vertically stacked on the substrate;
a first vertical structure penetrating the electrode structure on the first region and having a first width;
a second vertical structure penetrating the electrode structure on the second region and having a second width greater than the first width; and
a lower semiconductor pattern disposed between the substrate and each of the first and second vertical structures and connected to the substrate,
wherein each of the first and second vertical structures comprises a vertical semiconductor pattern connected to the lower semiconductor pattern, and a vertical insulating pattern disposed between the electrode structure and the vertical semiconductor pattern on the lower semiconductor pattern,
wherein the vertical insulating pattern comprises a sidewall portion on a sidewall of the electrode structure, and a protrusion extending on a portion of a top surface of the lower semiconductor pattern,
wherein the vertical semiconductor pattern comprises a vertical channel portion having a first thickness on the sidewall portion of the vertical insulating pattern, and a contact portion having a second thickness that is greater than the first thickness on a sidewall of the protrusion of the vertical insulating pattern.

14. The 3D semiconductor memory device of claim 13, wherein a top surface of the lower semiconductor pattern of the first vertical structure is disposed at a higher level than a top surface of the lower semiconductor pattern of the second vertical structure relative to the substrate.

15. The 3D semiconductor memory device of claim 13, wherein the sidewall portion of the vertical insulating pattern has a third thickness that is greater than the first thickness.

16. The 3D semiconductor memory device of claim 13, wherein each of the first and second vertical structures further comprises: a filling insulation pattern filling a gap region defined by the vertical channel portion and the contact portion of the vertical semiconductor pattern,
wherein a bottom surface of the filling insulation pattern of the second vertical structure is disposed at a lower level than a bottom surface of the filling insulation pattern of the first vertical structure relative to the substrate.

17. The 3D semiconductor memory device of claim 13, wherein a bottom surface of the vertical semiconductor pattern of the first vertical structure is disposed at a higher level than a top surface of a lowermost electrode of the electrodes relative to the substrate, and
wherein a bottom surface of the vertical semiconductor pattern of the second vertical structure is disposed at a lower level than the top surface of the lowermost electrode relative to the substrate.

18. The 3D semiconductor memory device of claim 13, wherein, in each of the first and second vertical structures, the contact portion of the vertical semiconductor pattern conformally extends along the top surface of the lower semiconductor pattern and has the second thickness on the top surface of the lower semiconductor pattern.

19. The 3D semiconductor memory device of claim 13, wherein the electrode structure has a stepped structure on the second region, and
wherein the second vertical structure penetrates the stepped structure of the electrode structure.

20. A three-dimensional semiconductor memory device comprising:
an electrode structure comprising electrodes stacked on a surface of a substrate having a first region comprising memory cells and a second region comprising interconnection lines; and
first and second vertical structures of different widths extending into the electrode structure on the first and second regions, respectively, each of the first and second vertical structures comprising:
- a vertical semiconductor pattern extending into the electrode structure; and
- a vertical insulating pattern comprising a sidewall disposed between the electrode structure and the vertical semiconductor pattern, and a protrusion laterally extending on the surface of the substrate, wherein a first thickness of the vertical semiconductor pattern on the protrusion of the vertical insulating pattern is greater than a second thickness of the vertical semiconductor pattern on the sidewall of the vertical insulating pattern.

* * * * *